US012646547B2

(12) United States Patent
Hatsuda

(10) Patent No.: US 12,646,547 B2
(45) Date of Patent: Jun. 2, 2026

(54) MEMORY DEVICE

(71) Applicant: Kioxia Corporation, Tokyo (JP)

(72) Inventor: Kosuke Hatsuda, Tokyo (JP)

(73) Assignee: Kioxia Corporation, Tokyo (JP)

( * ) Notice: Subject to any disclaimer, the term of this patent is extended or adjusted under 35 U.S.C. 154(b) by 109 days.

(21) Appl. No.: 18/749,367

(22) Filed: Jun. 20, 2024

(65) Prior Publication Data

US 2024/0428837 A1 Dec. 26, 2024

(30) Foreign Application Priority Data

Jun. 21, 2023 (JP) ................................. 2023-101784

(51) Int. Cl.
*G11C 11/16* (2006.01)
*G11C 5/06* (2006.01)
(52) U.S. Cl.
CPC .......... *G11C 11/1673* (2013.01); *G11C 5/063* (2013.01); *G11C 11/1697* (2013.01)
(58) Field of Classification Search
CPC ............ G11C 11/1655; G11C 11/1659; G11C 11/1673; G11C 11/1675; G11C 11/1697; G11C 13/004; G11C 5/063
USPC ........................................................ 365/158
See application file for complete search history.

(56) References Cited

U.S. PATENT DOCUMENTS

| | | | |
|---|---|---|---|
| 2004/0057326 A1 | 3/2004 | Ikehashi et al. | |
| 2005/0162953 A1 | 7/2005 | Morikawa | |
| 2011/0227639 A1 | 9/2011 | Phan et al. | |
| 2018/0144782 A1* | 5/2018 | Noguchi | H10N 50/80 |
| 2020/0145599 A1* | 5/2020 | Matsuzaki | H10D 30/6734 |
| 2023/0410853 A1* | 12/2023 | Katayama | G11C 5/063 |

FOREIGN PATENT DOCUMENTS

| | | |
|---|---|---|
| JP | 2001184881 A | 7/2001 |
| JP | 2005190626 A | 7/2005 |

* cited by examiner

*Primary Examiner* — Ly D Pham
(74) *Attorney, Agent, or Firm* — Kim & Stewart LLP

(57) ABSTRACT

A memory device includes a first wiring, a second wiring, a memory cell connected between the first wiring and the second wiring, a first power line, a sense amplifier, a current control circuit provided between the first power line and the sense amplifier and including a control terminal connected to a first node, a capacitance element provided between the first node and the second wiring and including a first terminal electrically connected to the second wiring and a second terminal connected to the first node, a second power line, and a first element having an electrical resistance provided between the first node and the second power line.

20 Claims, 14 Drawing Sheets

MEMORY DEVICE

CROSS-REFERENCE TO RELATED APPLICATION(S)

This application is based upon and claims the benefit of priority from Japanese Patent Application No. 2023-101784, filed Jun. 21, 2023, the entire contents of which are incorporated herein by reference.

FIELD

Embodiments described herein relate generally to a memory device.

BACKGROUND

A memory device in which a memory element or the like is integrated onto a semiconductor substrate has been proposed.

DESCRIPTION OF THE DRAWINGS

FIG. 2 is a perspective view schematically showing a configuration of a memory cell according to the embodiments.

DETAILED DESCRIPTION

Figure 1:
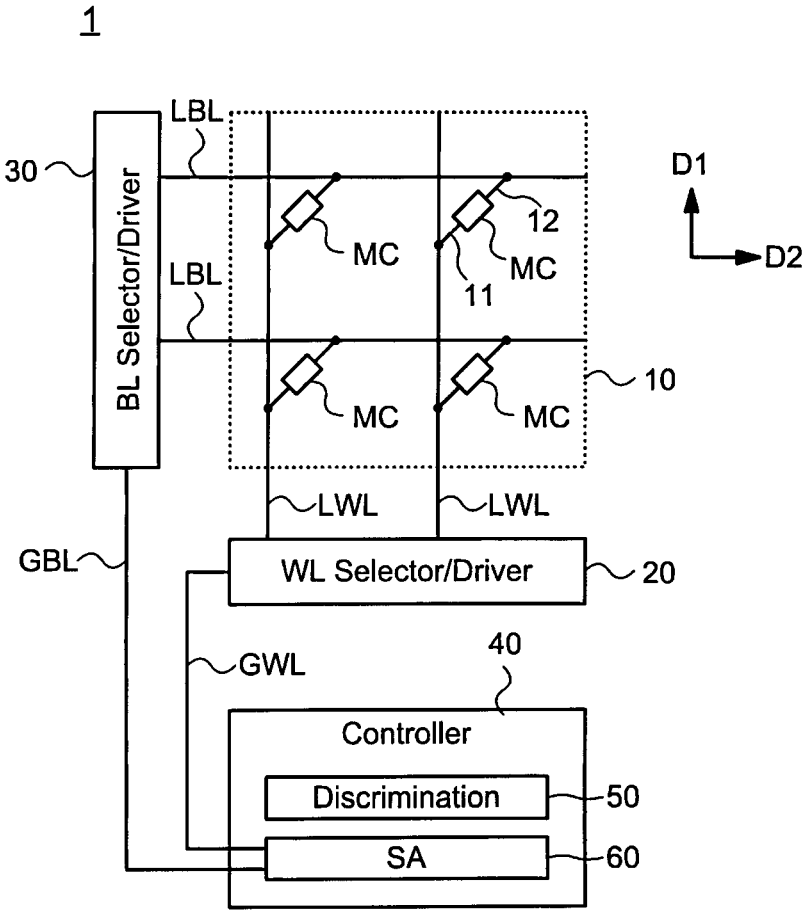
FIG. 1 is a block diagram showing an overall configuration of a memory system according to embodiments.

Embodiments provide a memory device capable of performing a read operation with high accuracy.

In general, according to one embodiment, a memory device includes a first wiring, a second wiring, a memory cell connected between the first wiring and the second wiring, a first power line, a sense amplifier, a current control circuit provided between the first power line and the sense amplifier and including a control terminal connected to a first node, a capacitance element provided between the first node and the second wiring and including a first terminal electrically connected to the second wiring and a second terminal connected to the first node, a second power line, and a first element having an electrical resistance provided between the first node and the second power line.

Hereinafter, a non-volatile semiconductor memory device according to the present embodiment will be specifically described with reference to the accompanying drawings. In the following description, elements having substantially the same functions and configurations are given the same reference numerals, and will be described repeatedly only when necessary. Each embodiment shown below is an example of an apparatus and a method for embodying the technical idea of this embodiment. The technical idea of the embodiment is not limited to the materials, shapes, structures, arrangement, and the like of the components described below. The technical idea of the embodiment may be changed in various ways within the scope of the claims.

In each embodiment of the present disclosure, a direction from a variable resistance element 101 to a switching element 102 is referred to as on or above. On the contrary, a direction from the switching element 102 to the variable resistance element 101 is referred to as under or below. As described above, for convenience of description, the description is made using the terms "above" and "below", but for example, the variable resistance element 101 and the switching element 102 may be disposed such that the up-down relationship therebetween is opposite to that shown in the drawings. In the following description, for example, the expression of the switching element 102 above the variable resistance element 101 merely describes the up-down relationship between the variable resistance element 101 and the switching element 102, and another member may be disposed between the variable resistance element 101 and the switching element 102. The term "above" or "below" means a stacking order in a structure in which a plurality of layers are stacked. In a case of expression of a bit line BL above a word line WL, the word line WL and the bit line BL may be in a positional relationship in which the word line WL and the bit line BL do not overlap with each other in a plan view. Meanwhile, in a case of expression of the bit line BL vertically above the word line WL, it means a positional relationship in which the word line WL and the bit line BL overlap with each other in a plan view.

In the present specification, the expressions "a includes A, B, or C", "a includes any of A, B, or C", and "a includes one selected from the group configured with A, B, and C" do not exclude a case where a includes a plurality of combinations of A to C, unless otherwise specified. Further, these expressions do not exclude the case where a includes other elements.

In the following description, "voltage" refers to a potential difference between two terminals, but may also refer to a voltage VSS or a potential with respect to a ground potential. The voltage VSS is a voltage that serves as a reference in the circuit system, and is, for example, 0 V or a ground potential.

1. First Embodiment

A memory system according to a first embodiment will be described with reference to FIGS. 1 to 11. For example, a memory system 1 according to the first embodiment includes a memory cell array 10 in which a plurality of memory cells MC are arranged, and a control circuit 40 that controls the memory cell.

1-1. Overall Configuration of Memory System

The overall configuration of the memory system according to the first embodiment will be described with reference to FIG. 1. FIG. 1 is a block diagram showing an overall configuration of the memory system according to an embodiment. As shown in FIG. 1, the memory system 1 includes a memory cell array 10, a word line selection/drive circuit 20 (WL Selector/Driver), a bit line selection/drive circuit 30 (BL Selector/Driver), and the control circuit 40 (Controller).

The memory cell array 10 is provided with a plurality of memory cells MC, a plurality of local word lines LWL, and a plurality of local bit lines LBL. Each local word line LWL extends in a D1 direction. Each local bit line LBL extends in a D2 direction. Each of the memory cells MC is provided between the local word line LWL and the local bit line LBL, and is electrically connected to the local word line LWL and the local bit line LBL. The memory cell MC is a two-terminal memory cell. A first terminal 11 of the memory cell MC is connected to the local word line LWL. A second terminal 12 of the memory cell MC is connected to the local bit line LBL. As will be described in detail below, the local word line LWL and the local bit line LBL intersect each other when viewed in the direction perpendicular to the D1 and D2 directions. In other words, the memory cell MC is provided at a position where the local word line LWL and the local bit line LBL intersect each other when viewed in the direction perpendicular to the D1 and D2 directions.

In FIG. 1, a configuration in which the D1 direction and the D2 direction are orthogonal to each other is shown. However, the D1 direction and the D2 direction may intersect each other at an angle other than a right angle. In FIG. 1, a configuration is shown in which the local word line LWL linearly extends in the D1 direction. However, the local word line LWL need not be linear. The local word line LWL may extend in the D1 direction generally for the entire local word line LWL. FIG. 1 shows a configuration in which the local bit line LBL linearly extends in the D2 direction.

However, the local bit line LBL need not be linear. The local bit line LBL may extend in the D2 direction generally for the entire local bit line LBL.

By selecting one local word line LWL and one local bit line LBL from the plurality of local word lines LWL and the plurality of local bit lines LBL, the memory cell MC, which is a target of the write operation and the read operation, is designated. Specifically, a predetermined current flows through the memory cell MC by applying a predetermined voltage to the specific local word line LWL and the specific local bit line LBL. By causing a predetermined current to flow through the memory cell MC, the write operation and the read operation with respect to the memory cell MC are executed. In the following description, the read operation with respect to the memory cell MC may be referred to as "sense operation" or "sense amplifier operation".

The word line selection/drive circuit 20, depicted as WL selector/driver in FIG. 1, is provided at a position adjacent to the memory cell array 10 in the D1 direction. Each local word line LWL is connected to the word line selection/drive circuit 20.

The bit line selection/drive circuit 30, depicted as BL selector/driver in FIG. 1, is provided at a position adjacent to the memory cell array 10 in the D2 direction. Each local bit line LBL is connected to the bit line selection/drive circuit 30.

The control circuit 40, depicted as controller in FIG. 1, is connected to the word line selection/drive circuit 20 and the bit line selection/drive circuit 30. The control circuit 40 includes a determination circuit 50 and a sense amplifier circuit 60 (SA). The control circuit 40 is connected to the word line selection/drive circuit 20 via a global word line GWL, and is connected to the bit line selection/drive circuit 30 via a global bit line GBL. More specifically, the global word line GWL and the global bit line GBL are connected to the sense amplifier circuit 60. As will be described in detail below, the sense amplifier circuit 60 executes a read operation on the memory cell MC.

The control circuit 40 executes a write operation and a read operation in response to a command. The control circuit 40 supplies a control signal to the word line selection/drive circuit 20 and the bit line selection/drive circuit 30 in accordance with the designated address in the write operation and the read operation. The word line selection/drive circuit 20 and the bit line selection/drive circuit 30 select the local word line LWL and the local bit line LBL corresponding to the designated address, respectively, in response to the control signal. The word line selection/drive circuit 20 and the bit line selection/drive circuit 30 apply a write voltage or a read voltage to the selected local word line LWL and the selected local bit line LBL, respectively.

In the present embodiment, the configuration is described in which one global word line GWL and one global bit line GBL are connected to the control circuit 40, but the present disclosure is not limited to this configuration. For example, a plurality of the global word lines GWL and the global bit lines GBL may be connected to the control circuit 40, respectively. The plurality of global word lines GWL and the global bit lines GBL may be connected to different memory cell arrays 10, respectively.

The global word line GWL may be connected to the plurality of local word lines LWL. The global bit line GBL may be connected to the plurality of local bit lines LBL. When the global bit line GBL is connected to a certain local bit line LBL, the global bit line GBL and the local bit line LBL are at the same potential, and thus, these may be collectively referred to as one bit line BL. Similarly, when the global word line GWL is connected to a certain local word line LWL, the global word line GWL and the local word line LWL are at the same potential, and thus, these may be collectively referred to as one word line WL.

The determination circuit 50 determines the data value stored in the memory cell MC based on the voltage (e.g., read voltage) of the memory cell MC obtained by the read operation. As will be described in detail below, the memory cell MC includes a variable resistance element 101 and stores binary data depending on a resistance state (low resistance state or high resistance state) of the variable resistance element 101. The determination circuit 50 determines the resistance state of the variable resistance element 101, whereby the data stored in the memory cell MC is determined.

1-2. Configuration of Memory Cell Array 10

Figure 2:
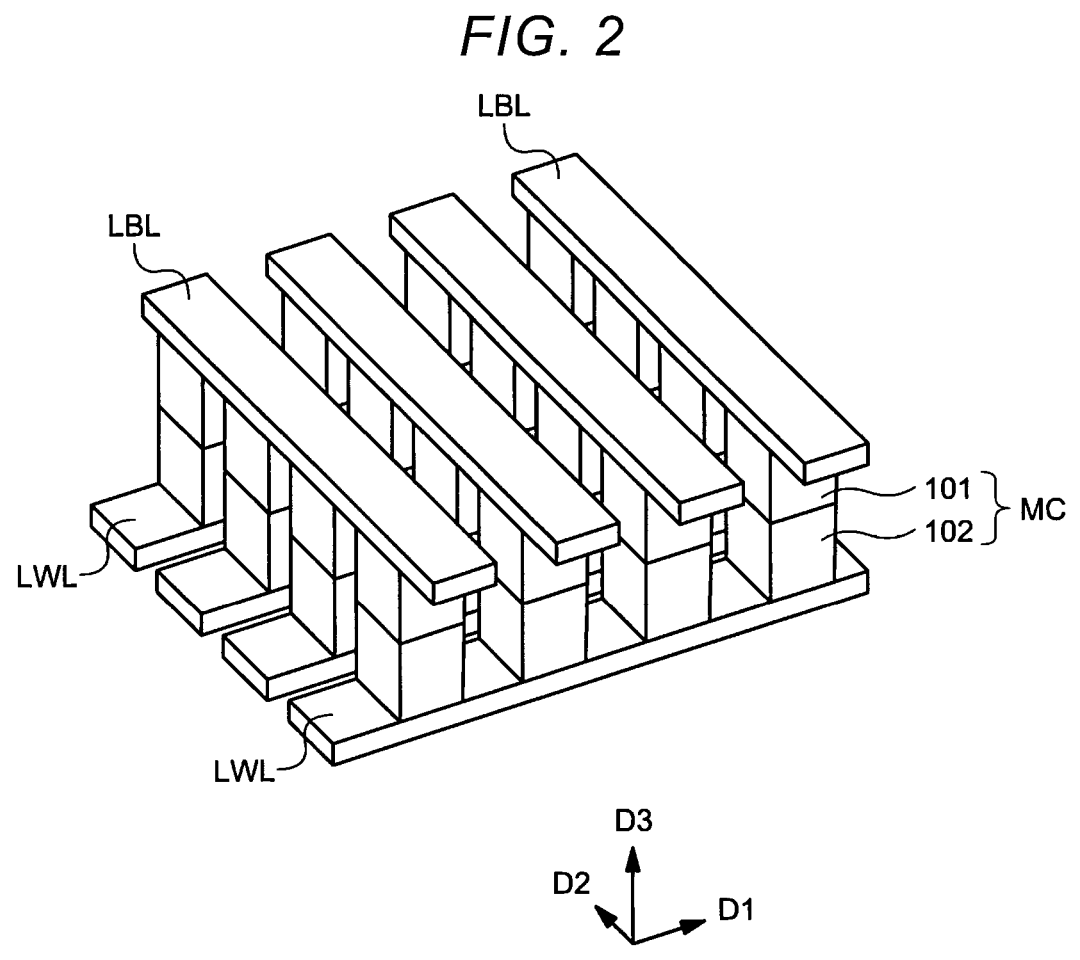

FIG. 2 is a perspective view schematically showing a configuration of a memory cell according to the embodiment. As shown in FIG. 2, the memory cell MC is provided above the local word line LWL (in a D3 direction). The local bit line LBL is provided above the memory cell MC (in the D3 direction). In other words, the memory cell MC is provided between the local word line LWL and the local bit line LBL in a region where the local word line LWL and the local bit line LBL that are provided in layers different from each other intersect each other when viewed in the D3 direction.

The memory cell MC includes the variable resistance element 101 and a switching element 102. The variable resistance element 101 and the switching element 102 are connected in series between the local word line LWL and the local bit line LBL. The switching element 102 is provided on the local word line LWL side. The variable resistance element 101 is provided on the local bit line LBL side.

The variable resistance element 101 is a non-volatile memory element that can be switched to a low resistance state or a high resistance state. In the present embodiment, a configuration will be described in which a magnetoresistive effect element including a magnetic tunnel junction (MTJ) is used as the variable resistance element 101. Hereinafter, the magnetoresistive effect element may be referred to as an MTJ element. The MTJ element is a memory element in which a resistance due to a tunnel effect in an insulating layer (referred to as a "tunnel resistance") is changed depending on a relationship (parallel or non-parallel) between magnetization directions of two magnetic layers adjacent to each other through the insulating layer. That is, the MTJ element has a plurality of resistance states according to a relative relationship (magnetization arrangement) between a magnetization direction of one magnetic layer and a magnetization direction of the other magnetic layer.

The switching element 102 is a two-terminal element. The switching element 102 is switched to a low resistance state or a high resistance state according to a voltage applied to two terminals. The resistance of the switching element 102 in the low resistance state is lower than the resistance of the variable resistance element 101 in the low resistance state. The resistance of the switching element 102 in the high resistance state is higher than the resistance of the variable resistance element 101 in the high resistance state. That is, when the switching element 102 is in the high resistance state, the resistance of the memory cell MC is substantially determined by the resistance of the switching element 102. On the other hand, when the switching element 102 is in the low resistance state, the resistance of the memory cell MC is substantially determined by the resistance of the variable resistance element 101.

Unlike the configuration of FIG. 2, the switching element 102 may be provided on the local bit line LBL side. The variable resistance element 101 may be provided on the local word line LWL side. The local word line LWL may be provided above the variable resistance element 101 (in the D3 direction). The local bit line LBL may be provided below the switching element 102 (in a direction opposite to the D3 direction). Another member may be provided between the local word line LWL and the variable resistance element 101. Similarly, another member may be provided between the local bit line LBL and the switching element 102.

In the present embodiment, a configuration in which the MTJ element is used as the variable resistance element 101 will be described, but a variable resistance element other than the MTJ element may be used as the variable resistance element 101. For example, as the variable resistance element 101, a resistance change type memory element (ReRAM), a ferroelectric memory (FeRAM), an organic memory, and a phase-change memory element (PRAM) may be used.

1-3. Configuration of MTJ Element

Figure 3:
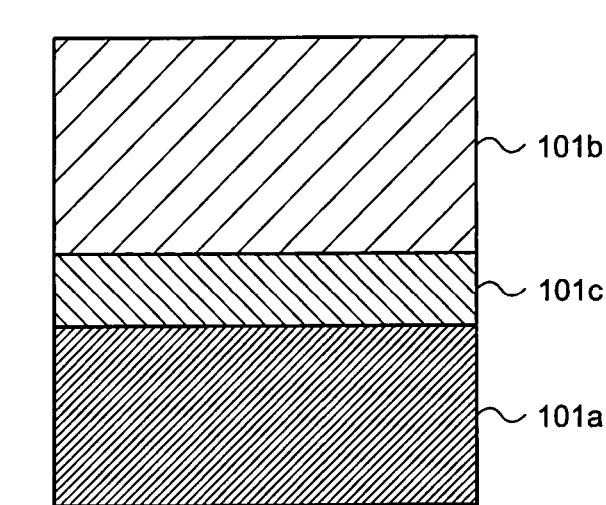
FIG. 3 is a sectional view schematically showing a configuration of a variable resistance element according to the embodiments.

FIG. 3 is a sectional view schematically showing a configuration of a variable resistance element according to the embodiment, which is applied to FIG. 2. As shown in FIG. 3, the MTJ element used as the variable resistance element 101 includes a reference layer 101a, a storage layer 101b, and a tunnel barrier layer 101c. The reference layer 101a is a ferromagnetic layer having first magnetism. The storage layer 101b is a ferromagnetic layer having second magnetism. The tunnel barrier layer 101c is a non-magnetic layer. A magnetization direction of the storage layer 101b is variable. A magnetization direction of the reference layer 101a is fixed. The magnetization direction of the storage layer 101b is changed by a write current supplied to the storage layer 101b. The magnetization direction of the storage layer 101b is determined by the direction of the write current. On the other hand, the magnetization direction of the reference layer 101a is not changed even when the write current is supplied to the reference layer 101a. The tunnel barrier layer 101c is an insulating layer. The expression "magnetization direction is variable" means that the magnetization direction can be changed between the time before the write current is supplied (before writing) and the time after the write current is supplied (after writing). The expression "magnetization direction is fixed" means that the magnetization direction is not changed between the time before the write current is supplied (before writing) and after the time the write current is supplied (after writing).

When the magnetization direction of the storage layer 101b is parallel to the magnetization direction of the reference layer 101a (when the magnetization directions are in the same direction), the MTJ element is in a low resistance state. When the magnetization direction of the storage layer 101b is antiparallel to the magnetization direction of the reference layer 101a (when the magnetization directions are opposite to each other), the MTJ element is in a high resistance state. As described above, since the resistance state (low resistance state or high resistance state) is controlled by the magnetization direction of the storage layer 101b, the MTJ element can store different binary data based on the resistance state.

FIG. 3 shows a configuration in which a top free type (the reference layer 101a is provided on the switching element 102 side) MTJ element in which the reference layer 101a is provided below the storage layer 101b is used as the variable resistance element 101, but the present disclosure is not limited to this configuration. As the variable resistance element 101, a bottom free type (the storage layer 101b is provided on the switching element 102 side) MTJ element in which the reference layer 101a is provided above the storage layer 101b may be used. The MTJ element may further include a shift canceling layer that cancels a magnetic field applied from the storage layer 101b to the reference layer 101a on the reference layer 101a side with respect to the tunnel barrier layer 101c.

1-4. Electrical Characteristics of Switching Element

Figure 4:
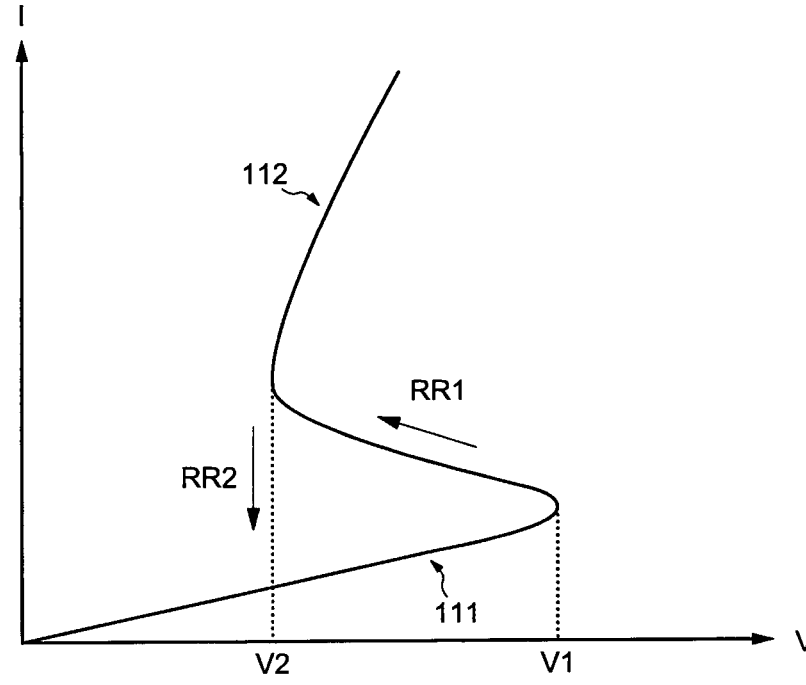
FIG. 4 is a view showing an electrical characteristic of a switching element according to the embodiments.

FIG. 4 is a view showing an electrical characteristic of a two-terminal type switching element according to the embodiment. As shown in FIG. 4, when the voltage applied between the two terminals is increased to reach a first voltage V1, the switching element 102 is switched from a high resistance state 111 to a low resistance state 112. The switching element 102 has a characteristic in which, when the switching element 102 is switched to the low resistance state 112, a voltage between the two terminals transitions to a second voltage V2 lower than the first voltage V1, and the current rapidly increases. Further, the switching element 102 has a characteristic that, when the voltage applied between the two terminals is decreased to reach the second voltage V2, the switching element 102 is switched from the low resistance state 112 to the high resistance state 111. That is, when the switching element 102 is switched from the high resistance state 111 to the low resistance state 112, the switching element 102 follows a negative resistance region between the voltage V1 and the voltage V2 (arrow RR1), but when the switching element 102 is switched from the low resistance state 112 to the high resistance state 111, the switching element 102 transitions to the high resistance state 111 without following the negative resistance region (arrow RR2). The switching element 102 has electrical characteristics that are symmetrical to each other in both directions (positive direction and negative direction).

The switching element 102 according to the present embodiment has a characteristic that, for example, as described above, the resistance value of the switching element 102 is rapidly lowered when the applied voltage reaches the voltage V1, and accordingly, the applied voltage is rapidly lowered to the voltage V2, and the current is increased (snapback). The switching element 102 of the present embodiment is a two-terminal type switching element. A material composition used in the switching element having such characteristics is appropriately selected according to the characteristics of the memory cell.

By applying a predetermined voltage between the local word line LWL and the local bit line LBL to switch the switching element 102 to a low resistance state, it is possible to perform a write operation and a read operation with respect to the variable resistance element 101.

1-5. Electrical Characteristics of Memory Cell MC

Figure 5:
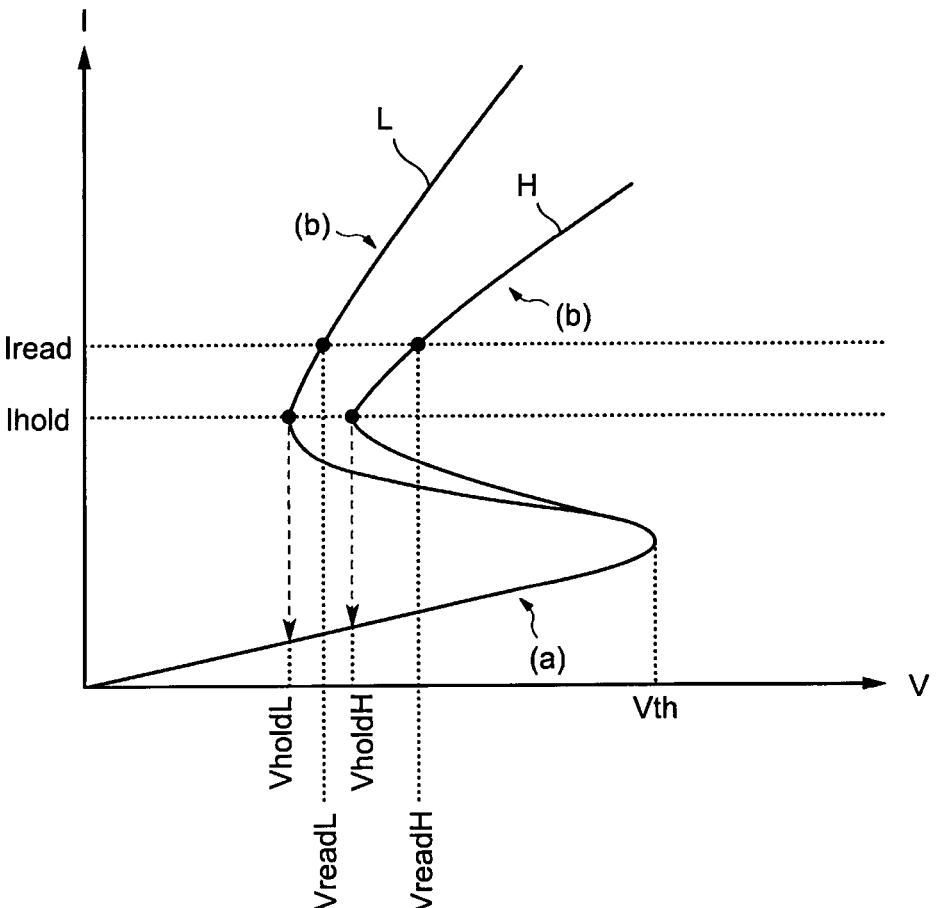
FIG. 5 is a view showing an electrical characteristic during a read operation of the memory cell according to the embodiments.

FIG. 5 is a view schematically showing an electrical characteristic during the read operation of the selected memory cell MC. In FIG. 5, the horizontal axis indicates the voltage between the two terminals of the selected memory cell MC (the voltage applied between the local word line LWL and the local bit line LBL), and the vertical axis indicates the current flowing through the selected memory cell MC. The characteristic (L) is a characteristic when the variable resistance element 101 is in a low resistance state. The characteristic (H) is a characteristic when the variable resistance element 101 is in a high resistance state.

As described above, the resistance of the switching element 102 in the high resistance state is higher than the resistance of the variable resistance element 101 in the high resistance state. In this case, the resistance of the memory cell MC is substantially determined by the resistance of the switching element 102. Therefore, there is substantially no difference in the electrical characteristics of the memory cell MC (corresponding to the characteristic portion (a)) before the switching element 102 is switched from the high resistance state to the low resistance state, even when the variable resistance element 101 is in the low resistance state or in the high resistance state. That is, there is substantially no difference in the voltages (threshold voltage Vth) applied between the two terminals of the memory cell MC when the switching element 102 is switched from the high resistance state to the low resistance state, even when the switching element 102 is in the low resistance state or in the high resistance state.

Meanwhile, since the resistance of the switching element 102 in the low resistance state is lower than the resistance of the variable resistance element 101 in the low resistance state, after the switching element 102 is switched from the high resistance state to the low resistance state, the resistance of the memory cell MC is substantially determined by the resistance of the variable resistance element 101. Therefore, in the electrical characteristics of the memory cell MC (corresponding to the characteristic portion (b)) after the switching element 102 is switched from the high resistance state to the low resistance state, the electrical characteristics when the variable resistance element 101 is in the low resistance state are different from the electrical characteristics when the variable resistance element 101 is in the high resistance state. Specifically, regarding the gradient of the voltage-current in the characteristic portion (b), the gradient when the variable resistance element 101 is in the high resistance state is smaller than the gradient when the variable resistance element 101 is in the low resistance state.

As shown in FIG. 5, with respect to a read current Iread in the read operation, the read voltage when the variable resistance element 101 is in the low resistance state is VreadL, and the read voltage when the variable resistance element 101 is in the high resistance state is VreadH. The read voltage VreadL is smaller than the read voltage VreadH. The resistance state (low resistance state or high resistance state) of the variable resistance element 101 can be determined based on a difference between the read voltage VreadL and the read voltage VreadH.

In FIG. 5, a hold current Ihold is a current that flows through the memory cell MC when the switching element 102 is switched from the low resistance state to the high resistance state. The hold voltage Vhold is a voltage applied between the two terminals of the memory cell MC when the hold current Ihold flows through the memory cell MC. The hold voltage when the variable resistance element 101 is in a low resistance state is VholdL. The hold voltage when the variable resistance element 101 is in a high resistance state is VholdH. When the hold voltages VholdL and VholdH are not distinguished from each other, these are simply referred to as a hold voltage Vhold.

1-6. Functional Configuration of Determination Circuit

Figure 6:
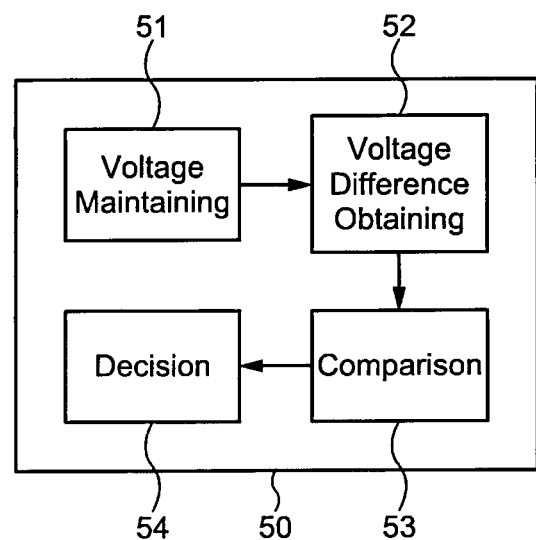
FIG. 6 is a block diagram showing a functional configuration of a determination circuit provided in the memory system according to the embodiments.

FIG. 6 is a block diagram showing a functional configuration of a determination circuit provided in the memory system according to the embodiment. As shown in FIG. 6, the determination circuit 50 includes a voltage holding unit 51 (Voltage Maintaining), a voltage difference acquisition unit 52 (Voltage Difference Obtaining), a comparison unit 53 (Comparison), and a determination unit 54 (Decision).

The voltage holding unit 51 holds the read voltage (VreadL or VreadH) obtained by the read operation of the memory cell MC as the determination target voltage. As described above, the read operation of the data stored in the memory cell MC may be referred to as a "first read operation".

Further, the voltage holding unit 51 holds a reference voltage for performing the data determination for the determination target voltage. The reference voltage is acquired by a second read operation performed after the first read operation. After the above-described first read operation, a write operation to the variable resistance element 101 is performed. The second read operation is performed after the variable resistance element 101 is switched to the low resistance state or the high resistance state. A resistance state of the variable resistance element 101 when the first read operation is performed may be referred to as a "determination target resistance state", and a resistance state of the variable resistance element 101 when the second read operation is performed may be referred to as a "reference resistance state".

The voltage difference acquisition unit 52 acquires the voltage difference between the determination target voltage and the reference voltage held by the voltage holding unit 51.

The comparison unit 53 compares the voltage difference acquired by the voltage difference acquisition unit 52 with the reference voltage difference. The reference voltage difference is, for example, a value obtained by multiplying a voltage difference between the read voltage VreadL when the variable resistance element 101 is in a low resistance state and the read voltage VreadH when the variable resistance element 101 is in a high resistance state by ½.

The determination unit 54 determines the resistance state of the variable resistance element 101 based on the comparison result acquired by the comparison unit 53. Specifically, when the voltage difference between the determination target voltage and the reference voltage is smaller than the reference voltage difference, it is determined that the determination target resistance state of the variable resistance element 101 is the same resistance state as the reference resistance state. When the voltage difference between the determination target voltage and the reference voltage is larger than the reference voltage difference, it is determined that the determination target resistance state of the variable resistance element 101 is a resistance state different from the reference resistance state.

1-7. Sense Circuit

Figure 7:
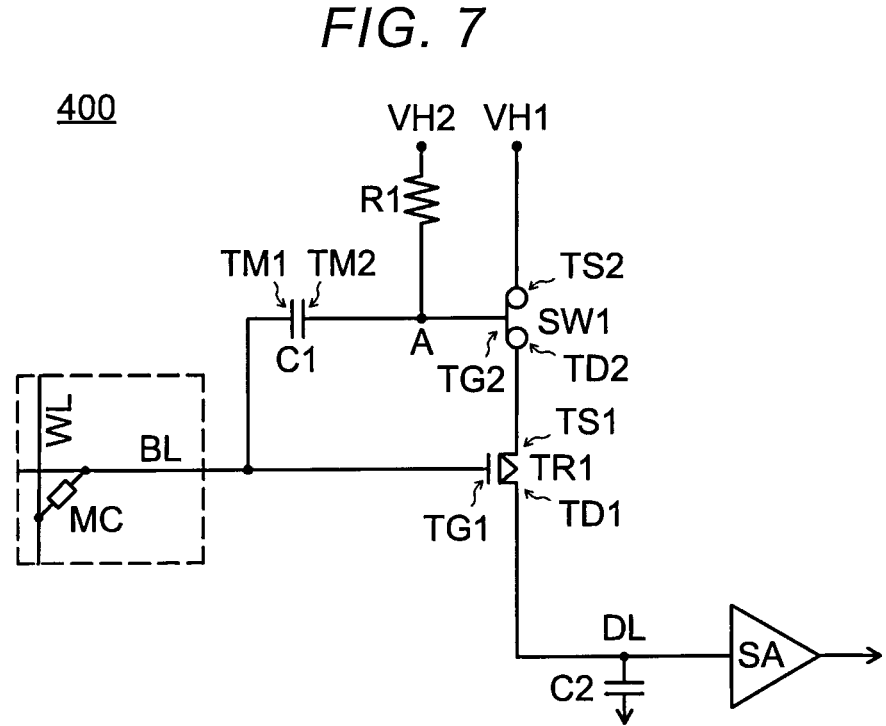
FIG. 7 is a circuit diagram for executing a sense operation of a memory device according to a first embodiment.

A sense circuit 400 provided in the control circuit 40 will be described with reference to FIG. 7. FIG. 7 is a circuit diagram for executing a sense operation of a memory device according to the embodiment. The sense circuit 400 shown in FIG. 7 shows a state in which the global bit line GBL shown in FIG. 1 is connected to one local bit line LBL and the global word line GWL is connected to one local word line LWL. As described above, these bit lines are indicated by BL, and these word lines are indicated by WL. That is, the bit line BL shown in FIG. 7 may be the local bit line LBL or the global bit line GBL. Similarly, the word line WL shown in FIG. 7 may be the local word line LWL or the global word line GWL. The sense circuit 400 executes a sense operation with respect to the memory cell MC selected by the bit line BL and the word line WL.

The word line WL may be referred to as a "wiring". The bit line BL may be referred to as a "wiring". In this case, it may be said that the memory cell MC is connected to a first wiring, e.g., the word line WL and a second wiring, e.g., the bit line BL between the first wiring and the second wiring.

As shown in FIG. 7, the sense circuit 400 includes a transistor TR1, a switching element SW1, a resistance element R1, a capacitance element C1, a capacitance element C2, a first power line VH1, a second power line VH2, and a sense amplifier SA.

The transistor TR1 and the switching element SW1 are PMOS transistors in the present embodiment. In FIG. 7, the transistor TR1 is a three-terminal type element including a first terminal TS1, a second terminal TD1, and a gate terminal TG1. The transistor TR1 is used as an element that controls the current amount between the first terminal TS and the second terminal TD1 according to the voltage supplied to the gate terminal TG1. As will be described in detail below, the gate terminal TG1 is electrically connected to the bit line BL. Therefore, the amount of current flowing through the transistor TR1 is controlled by the voltage of the bit line BL.

The switching element SW1 is a three-terminal type element including a first terminal TS2, a second terminal TD2, and a gate terminal TG2, similarly to the transistor TR1. However, the switching element SW1 is used as an element that simply switches between an on state and an off state, unlike the transistor TR1. A state (on state or off state) of the switching element SW1 is determined by a voltage supplied to the first terminal TS2 and the gate terminal TG2. In the case of the present embodiment, a voltage for controlling the switching element SW1 to an off state is supplied to the first power line VH1 and the second power line VH2. For example, a high voltage VHH is supplied to the first power line VH1, and a voltage (VHH-Vth) smaller than the high voltage VHH by the threshold voltage Vth of the switching element SW1 is supplied to the second power line VH2.

The transistor TR1 and the switching element SW1 may be collectively referred to as a "current control circuit". The current control circuit is controlled by the gate terminal TG1 of the transistor TR1 and the gate terminal TG2 of the switching element SW1. Therefore, at least any one of the gate terminal TG1 or the gate terminal TG2 is referred to as a "control terminal" for controlling the current control circuit.

The first terminal TS1 of the transistor TR1 is connected to the second terminal TD2 of the switching element SW1. The second terminal TD1 of the transistor TR1 is connected to the sense amplifier SA and the capacitance element C2 via the data wiring DL. The first terminal TS2 of the switching element SW1 is connected to the first power line VH1. That is, the transistor TR1 and the switching element SW1 are provided between the first power line VH1 and the sense amplifier SA.

The gate terminal TG1 of the transistor TR1 is connected to the bit line BL and a first terminal TM1 of the capacitance element C1. The gate terminal TG2 of the switching element SW1 is connected to the first node A, the resistance element R1, and a second terminal TM2 of the capacitance element C1. That is, the capacitance element C1 is provided between the first node A and the bit line BL. The first terminal TM1 of the capacitance element C1 is electrically connected to the bit line BL. In the case of the present embodiment, the first terminal TM1 is connected to the bit line BL via the wiring, instead of the capacitive coupling. In other words, the first terminal TM1 is connected to the bit line BL such that current can be supplied therethrough. The second terminal TM2 of the capacitance element C1 is connected to the first node A.

The capacitance element C1 may be formed of the same layer as the conductive layer and the insulating layer of the transistor TR1. For example, the capacitance element C1 may be a capacitance element that is formed of the semiconductor layer, the gate insulating layer, and the gate electrode of the transistor TR1 and that uses the gate insulating layer as a dielectric.

The resistance element R1 is provided between the second power line VH2 and the first node A. The resistance element R1 is formed in, for example, a semiconductor layer into which an impurity is introduced. Specifically, for a semiconductor layer which is the same layer as the semiconductor layer used as the channel of the transistor TR1 or the same layer as the semiconductor layer (for example, a polycrystalline silicon layer) used as the gate electrode of the transistor TR1, a semiconductor layer which is made into a low-resistance layer by implanting impurity ions may be used as the resistance element R1. The resistance element R1 may be replaced with an element having a resistance component. As will be described in detail below, for example, the resistance element R1 may be replaced with a transistor. The electric resistance of the resistance element R1 is larger than the electric resistance between the second terminal TM2 and the gate terminal TG2.

As described above, the bit line BL and the first node A are capacitively coupled by the capacitance element C1. Therefore, the voltage of the first node A is changed as the voltage of the bit line BL changes. As will be described in detail below, the voltage of the first node A is changed from the potential for controlling the switching element SW1 to the off state to the potential for controlling the switching element SW1 to the on state, so that the switching element SW1 is switched from the off state to the on state.

With the above-described configuration, in the sense circuit 400 according to the present embodiment, the voltage of the first node A is changed in association with the change in voltage of the bit line BL, and the state of the switching element SW1 is switched. As will be described in detail below, in the present embodiment, when the sense operation of the sense circuit 400 is started, the voltage of the bit line BL is lowered in accordance with the write state of the memory cell MC corresponding to the electric resistance thereof. That is, in the sense circuit 400, the state of the switching element SW1 is switched at the time at which the sense operation is started. Therefore, for example, even when a deviation occurs in timing between the start of the sense operation and the decrease in the voltage of the bit line BL due to the characteristic variation or the like of the memory cell MC, the sense operation of the memory cell MC can be accurately performed.

1-8. Sense Circuit of Comparative Examples and Operation Thereof

Figure 18:
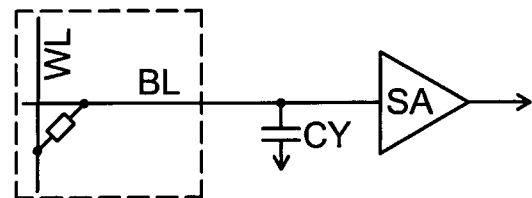
FIG. 18 is a circuit diagram for executing a sense operation of a memory device according to a first comparative example.

A sense circuit of the comparative examples and an operation thereof will be described with reference to FIGS. 18 to 23. FIG. 18 is a circuit diagram for executing a sense operation of a memory device according to a first Comparative Example 1. As shown in FIG. 18, a sense circuit 400Y includes a capacitance element CY and a sense amplifier SA.

The bit line BL is connected to both the capacitance element CY and the sense amplifier SA.

Figure 19:
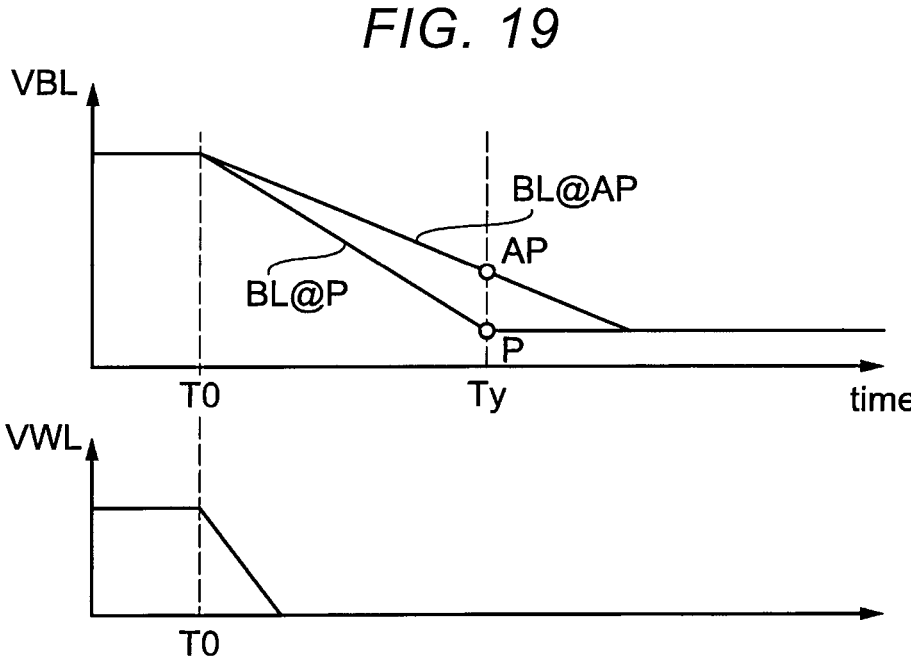
FIG. 19 is a view showing the sense operation of the memory device according to the first comparative example.

FIG. 19 is a view showing the sense operation of the memory device according to Comparative Example 1. As shown in FIG. 19, in the sense circuit 400Y according to Comparative Example 1, the state of the memory cell MC is determined based on a voltage VBL of the bit line BL after a predetermined time elapses (time Ty) from a time T0 at which the sense operation is started. As shown in FIG. 19, before the sense operation is started, a high voltage (H level) is supplied to the bit line BL, and the bit line BL is maintained in a floating state, so that the bit line BL is maintained at the H level. When the sense operation is started, the voltage VWL of the word line WL is controlled from the high voltage (H level) to the low voltage (L level). With the decrease in the voltage VWL, the charge of the bit line BL is transferred to the word line WL via the memory cell MC, so that the voltage VBL of the bit line BL also decreases.

The decrease rate of the voltage VBL of the bit line BL depends on the electric resistance of the memory cell MC. As shown in FIG. 19, when the electric resistance of the memory cell MC is small (BL@P), the transfer of the charge from the bit line BL to the word line WL is relatively fast, so that the voltage VBL of the bit line BL decreases quickly. On the other hand, when the electric resistance of the memory cell MC is large (BL@AP), the transfer of the charge from the bit line BL to the word line WL is relatively slow, so that the voltage VBL of the bit line BL decreases slowly.

Ideally, since the voltage VBL of the bit line BL at a time Ty depends on the electric resistance of the memory cell MC, as shown in FIG. 19, the voltage VBL (P) of the BL@P is smaller than the voltage VBL (AP) of the BL@AP. In the sense circuit 400Y according to Comparative Example 1, the state of the memory cell MC is determined by using the above-described difference. This determination is premised on the fact that the decrease in the voltage VBL of the bit line BL in the plurality of memory cells MC occurs at the same time as the decrease in the voltage VWL of the word line WL or at a certain time. However, it was discovered that, in a process of creating the present embodiment, the above-described premise may not always be correct due to the characteristic variation of the memory cell MC. This is newly recognized by the inventor, and was not recognized by those skilled in the art from the related art.

Figure 20:
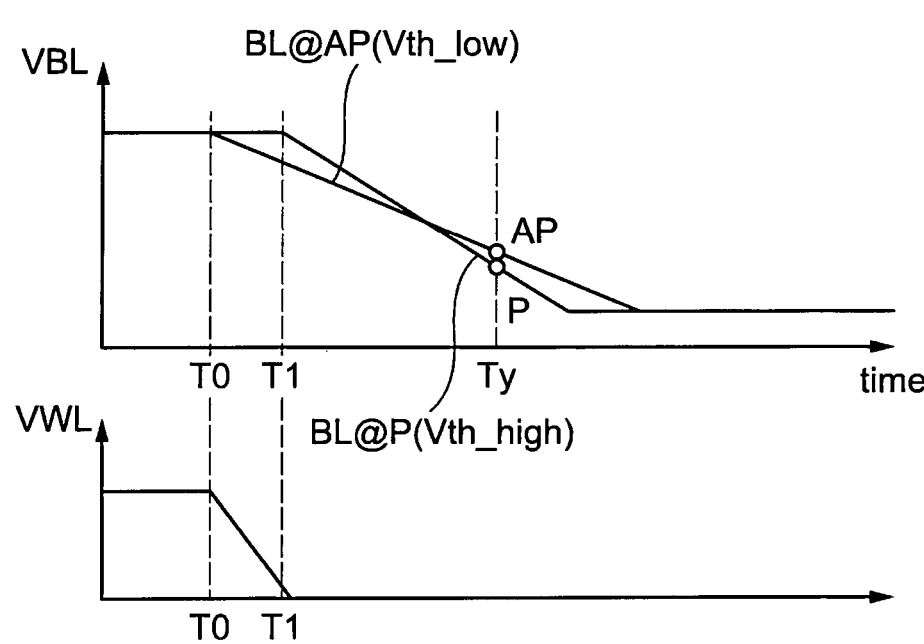
FIG. 20 is a view showing the sense operation of the memory device according to the first comparative example.

FIG. 20 is a view showing the sense operation of the memory device according to Comparative Example 1. The view shown in FIG. 20 is similar to the view shown in FIG. 19, but the time at which the voltage VBL of the BL@P is decreased is later than the time at which the voltage VBL of the BL@AP is decreased. Specifically, the voltage VBL of the BL@AP starts to decrease from a time T0, whereas the voltage VBL of the BL@P starts to decrease from a time T1.

For example, when the MTJ element shown in FIGS. 2 to 4 is used as the memory cell MC, the switching element 102 is switched from the high resistance state to the low resistance state when a potential difference between the word line WL and the bit line BL is larger than the threshold voltage Vth. When the threshold voltage Vth is relatively low, the voltage VBL decreases from the time T0. On the other hand, when the threshold voltage Vth is relatively high, the voltage VBL decreases from the time T1. Therefore, the voltage VBL of the BL@AP when the threshold voltage Vth is relatively low is indicated by "BL@AP (Vth_low)", and the voltage VBL of the BL@P when the threshold voltage Vth is relatively high is indicated by "BL@P (Vth_high)".

In such a case, despite the difference in the decrease rate of the voltage VBL due to the electric resistance of the memory cell MC, the difference between the voltages VBL of both BL@AP and BL@P is reduced at the time Ty. As a result, the state of the memory cell MC cannot be determined.

Figure 21:
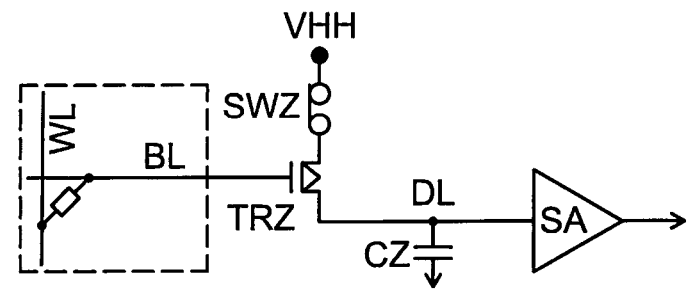
FIG. 21 is a circuit diagram for executing the sense operation of the memory device according to a second comparative example.

FIG. 21 is a circuit diagram for executing a sense operation of a memory device according to Comparative Example 2. As shown in FIG. 21, a sense circuit 400Z includes a switching element SWZ, a transistor TRZ, a capacitance element CZ, and a sense amplifier SA. The bit line BL is connected to a gate terminal of the transistor TRZ. The switching element SWZ and the transistor TRZ are elements having the same functions as the switching element SW1 and the transistor TR1 shown in FIG. 7, and thus, the description thereof will be omitted. Similarly to the sense circuit 400 shown in FIG. 7, in the sense circuit 400Z, the amount of current flowing through the transistor TRZ is controlled by the voltage of the bit line BL.

Figure 22:
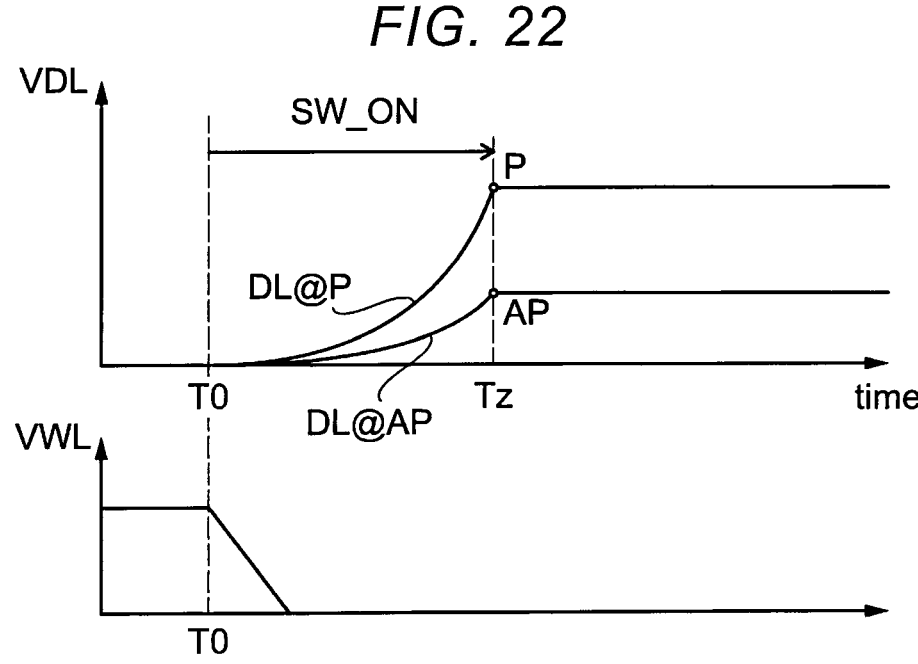
FIG. 22 is a view showing the sense operation of the memory device according to the second comparative example.

FIG. 22 is a view showing the sense operation of the memory device according to Comparative Example 2. As shown in FIG. 22, in the sense circuit 400Z according to Comparative Example 2, the state of the memory cell MC is determined based on the voltage VBL of the bit line BL after a predetermined time elapses (time Tz) from the time T0 at which the sense operation is started. As shown in FIG. 22, before the sense operation is started, the bit line BL is maintained in a floating state, so that the bit line BL is maintained at the H level. When the sense operation is started, the voltage VWL of the word line WL is controlled from the H level to the L level. With the decrease in the voltage VWL, the charge of the bit line BL is transferred to the word line WL via the memory cell MC, so that the voltage of the bit line BL also decreases as shown in FIG. 19. When the voltage of the bit line BL is lowered, the potential difference between the gate terminal and the source terminal of the transistor TRZ is increased, so that the amount of current flowing through the transistor TRZ is increased.

As shown in FIG. 19, since the decrease rate of the voltage of the bit line BL is different depending on the electric resistance of the memory cell MC, the increase rate in the amount of current flowing through the transistor TRZ is different. Specifically, when the electric resistance of the memory cell MC is small (DL@P), the increase rate in the amount of current flowing through the transistor TRZ is relatively fast, and thus, the voltage VDL of the data wiring DL rises relatively quickly. On the other hand, when the electric resistance of the memory cell MC is large (DL@AP), the increase rate in the amount of current flowing through the transistor TRZ is relatively slow, and thus, the voltage VDL of the data wiring DL rises relatively slowly.

Ideally, since the voltage VDL of the data wiring DL at the time Tz depends on the electric resistance of the memory cell MC, as shown in FIG. 22, the voltage VDL (P) of DL@P is larger than the voltage VDL (AP) of the DL@AP. In the sense circuit 400Z according to Comparative Example 2, the state of the memory cell MC is determined by using the above-described difference.

The above-described determination is premised on the fact that the decrease in the voltage VBL of the bit line BL in the plurality of memory cells MC occurs at the same time as the decrease in the voltage VWL of the word line WL or at a certain time. However, as described above, the above-described premise may not always be correct due to the characteristic variation of the memory cell MC.

Figure 23:
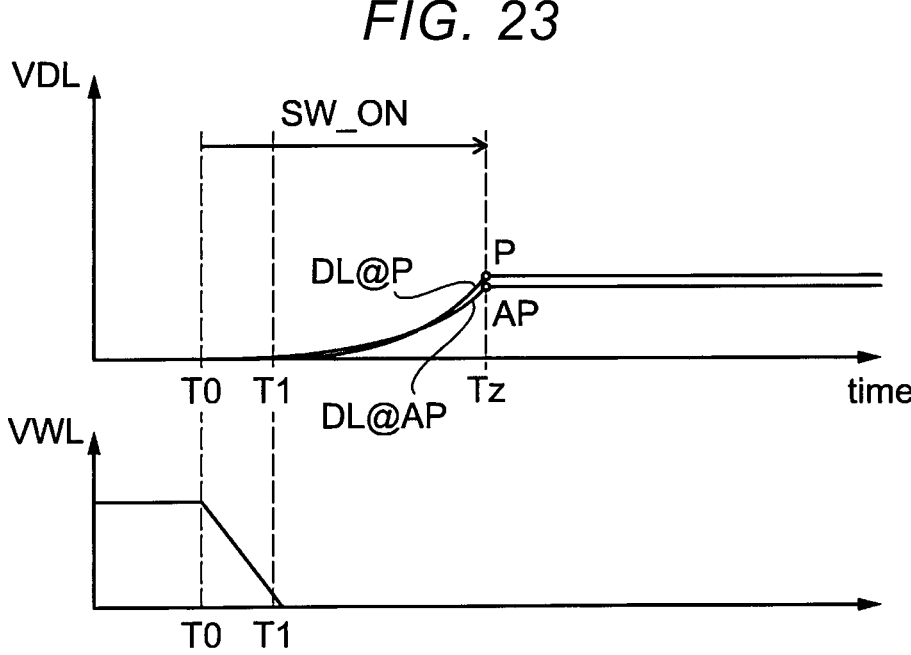
FIG. 23 is a view showing the sense operation of the memory device according to the second comparative example.

FIG. 23 is a view showing the sense operation of the memory device according to Comparative Example 2. The view shown in FIG. 23 is similar to the view shown in FIG. 22, but the time at which the voltage VDL of the DL@P is increased is later than the time at which the voltage VDL of the DL@ AP is increased. Specifically, the voltage VDL of the DL@AP starts to increase from the time T0, whereas the voltage VDL of the DL@P starts to increase from the time T1.

In such a case, despite the difference in the increase rate of the voltage VDL due to the electric resistance of the memory cell MC, the difference between the voltages VDL of both DL@AP and DL@P is reduced at the time Tz. As a result, the state of the memory cell MC cannot be determined.

1-9. Operation of Sense Circuit

Figure 8:
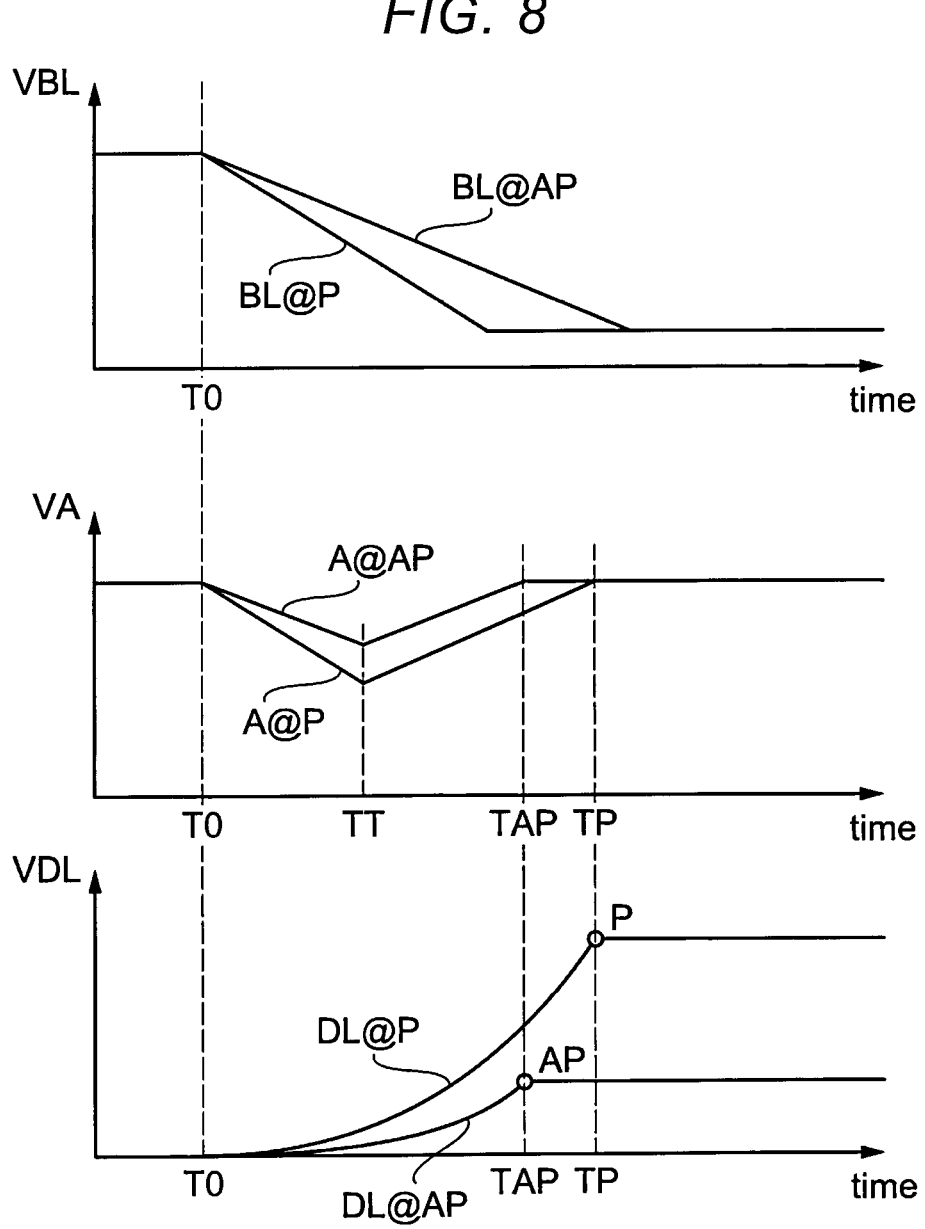
FIG. 8 is a view showing the sense operation of the memory device according to the first embodiment.

The operation of the sense circuit 400 will be described with reference to FIG. 8. FIG. 8 is a view showing the sense operation of the memory device according to the embodiment. In FIG. 8, the voltage VBL of the bit line BL, the voltage VA of the first node A, and the voltage VDL of the data wiring DL are shown to be aligned vertically. In each graph showing the voltage, the voltage (@P) when the electric resistance of the memory cell MC is small and the voltage (@AP) when the electric resistance of the memory cell MC is large are shown. In these graphs, the time T0 is a start time of the sense operation. In FIG. 8, a voltage VBL corresponding to @P is indicated by BL@P, and the voltage VBL corresponding to @AP is indicated by BL@AP. Similarly, a voltage VA corresponding to @P is indicated by A@P, and the voltage VA corresponding to @AP is indicated by A@AP. Similarly, a voltage VDL corresponding to @P is indicated by DL@P, and the voltage VDL corresponding to @AP is indicated by DL@AP.

As shown in the graph of the voltage VBL of FIG. 8, when the sense operation is started at the time T0, the voltage VBL of the bit line BL decreases in the same manner as in FIG. 19. As described with reference to FIG. 19, the decrease in the voltage VBL of the BL@P due to the electric resistance of the memory cell MC is faster than the decrease in the voltage VBL of the BL@AP.

A voltage for controlling the switching element SW1 to off state is supplied to the first power line VH1 and the second power line VH2, and both the voltage VBL and the voltage VA are at the H level, so that the switching element SW1 is in an off state before the sense operation is started.

Since the bit line BL and the first node A are capacitively coupled by the capacitance element C1, when the sense operation is started at the time T0, the voltage VBL of the bit line BL decreases, and the voltage VA of the first node A also decreases. When the voltage VA is lowered and the potential difference between the first terminal TS2 and the gate terminal TG2 exceeds the threshold voltage Vth of the switching element SW1, the switching element SW1 (PMOS) is switched from the off state to the on state.

Although the first node A is connected to the second power line VH2, the resistance element R1 is provided between the first node A and the second power line VH2, so that a delay occurs when the voltage VA of the first node A is returned to the same potential as the second power line VH2. As a result, the voltage VA of the first node A decreases from the time T0, but then increases with the supply of the charge from the second power line VH2. In FIG. 8, a point in time at which the voltage VA is switched from the decrease to the increase is referred to as a time TT. The voltage VA rises from the time TT, and the potential difference between the first terminal TS2 and the gate terminal TG2 is equal to or lower than the threshold voltage Vth of the switching element SW1, so that the switching element SW1 is switched to the off state.

As described above, since the decrease in the voltage VBL of the BL@P is faster than the decrease in the voltage VBL of the BL@AP, the voltage VA of the A@P at the time TT is lower than the voltage VA of the A@AP. As a result, the time TP at which the voltage VA of the A@P returns to the H level is later than the time TAP at which the voltage VA of the A@AP returns to the H level.

The voltage VBL is a voltage supplied to the gate terminal TG1 of the transistor TR1. The voltage VA is a voltage supplied to the gate terminal TG2 of the switching element SW1. In the present embodiment, since both the transistor TR1 and the switching element SW1 are PMOS transistors, when the voltage VBL and the voltage VA decrease, the transistor TR1 and the switching element SW1 are switched to an on state. As a result, the voltage VDL of the data wiring DL gradually increases. As shown in the graph of the voltage VDL in FIG. 8, the voltage VDL starts to rise from the time T0. When the voltage VDL reaches the time TP or the time TAP at which the switching element SW1 is switched to the off state, the rise of the voltage VDL ends. As a result, the voltage VDL (P) of the DL@P is higher than the voltage VDL (AP) of the DL@AP. The sense circuit 400 can determine the state of the memory cell MC by using the above-described potential difference.

Figures 9, 10:
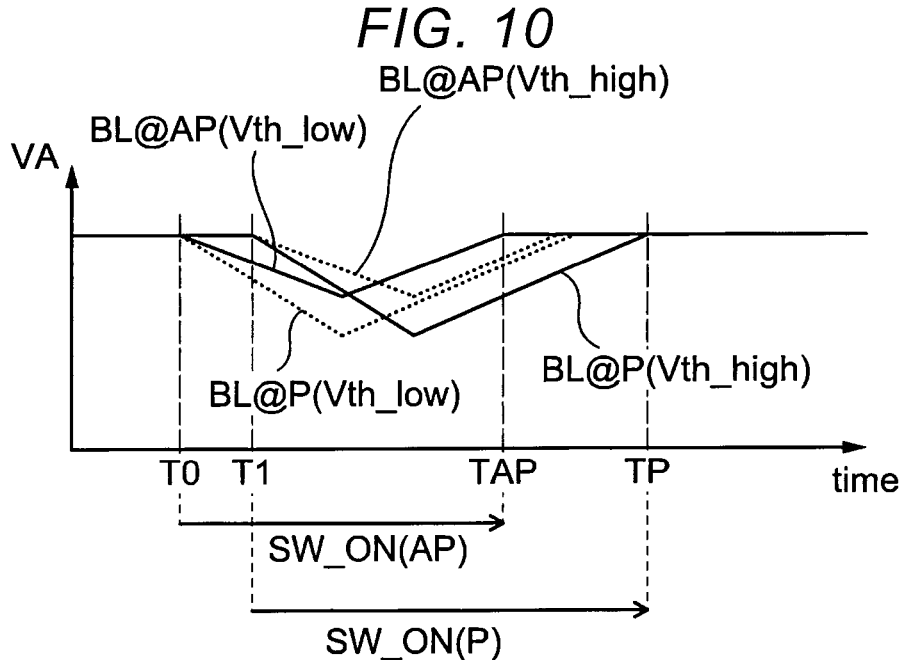
FIG. 9 is a view showing the sense operation of the memory device according to the first embodiment.
FIG. 10 is a view showing the sense operation of the memory device according to the first embodiment.
Figures 11, 12:
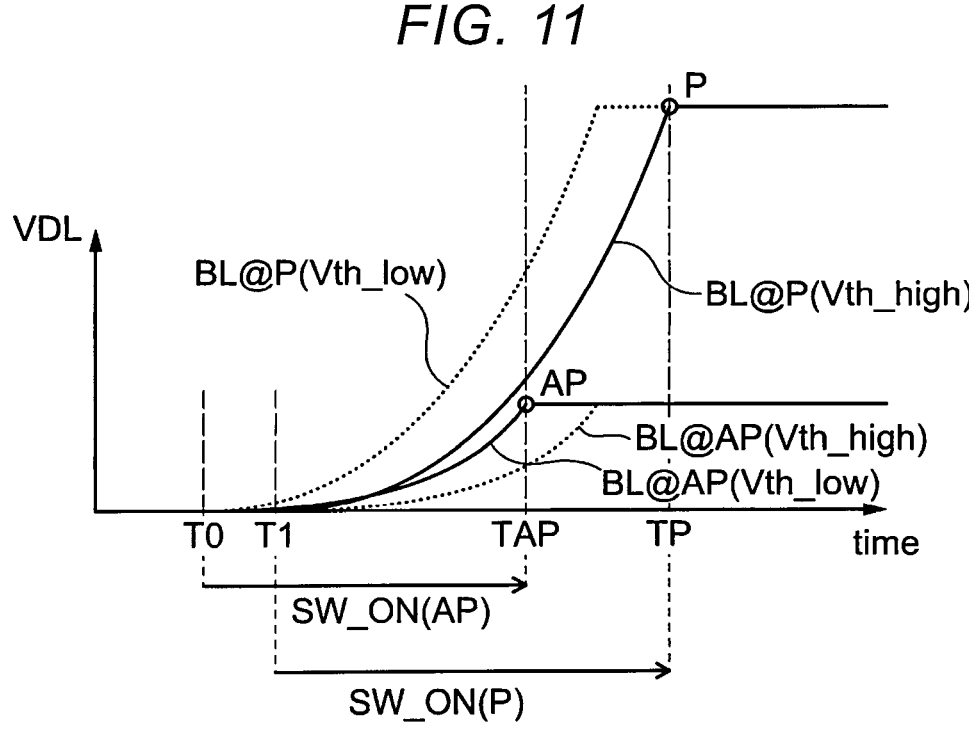
FIG. 11 is a view showing the sense operation of the memory device according to the first embodiment.
FIG. 12 is a circuit diagram for executing a sense operation of a memory device according to a first modification example of the first embodiment.

Next, an operation when the time at which the voltage VBL of the BL@P is decreased is later than the time at which the voltage VBL of the BL@AP is decreased will be described with reference to FIGS. 9 to 11. FIGS. 9 to 11 are views showing the sense operation of the memory device according to the embodiment. In the graphs of the voltage VBL shown in FIGS. 9 to 11, two solid line graphs and two dotted line graphs are shown. The two solid line graphs are the same as the two graphs of the voltage VBL shown in FIG. 20.

Of the two solid line graphs, BL@AP (Vth_low) is a graph of the voltage VBL when the electric resistance of the memory cell MC is large and the threshold voltage Vth of the memory cell MC is low. BL@P (Vth_high) is a graph of the voltage VBL when the electric resistance of the memory cell MC is small and the above-described threshold voltage Vth is high. Of the two dotted line graphs, BL@AP (Vth_high) is a graph of the voltage VBL when the electric resistance of the memory cell MC is large and the above-described threshold voltage Vth is high. BL@P (Vth_low) is a graph of the voltage VBL when the electric resistance of the memory cell MC is small and the above-described threshold voltage Vth is low.

As shown in FIG. 9, in the graph of the voltage VBL when the electric resistance of the memory cell MC is large, the decrease rate of the voltage VBL is relatively fast, and in the graph of the voltage VBL when the electric resistance is small, the decrease rate of the voltage VBL is relatively slow. In the graph of the voltage VBL when the above-described threshold voltage Vth is low, the voltage VBL decreases from the time T0, and in the graph of the voltage VBL when the threshold voltage Vth is high, the voltage VBL decreases from the time T1.

In FIG. 9, the difference between the voltage VBL (P) of BL@P (Vth_high) and the voltage VBL (AP) of BL@AP (Vth_low) at the time Tz is small.

As shown in FIG. 10, the voltage VA of BL@AP (Vth_low) decreases from the time TO, then increases with the supply of the charge from the second power line VH2, and returns to the original voltage at the time TAP. Similarly, the voltage VA of BL@P (Vth_high) decreases from the time T1, then increases with the supply of the charge from the second power line VH2, and returns to the original voltage at the time TP. In a period SW_ON (AP) from the time T0 to the time TAP, the switching element SW1 is in an on state. Similarly, in a period SW_ON (P) from the time T0 to the time TP, the switching element SW1 is in an on state.

The decrease rate of voltage VA of BL@P (Vth_high) is faster than the decrease rate of the voltage VA of BL@AP (Vth_low). Therefore, the voltage when the voltage VA of BL@P (Vth_high) switches from the decrease to the increase is lower than the voltage when the voltage VA of BL@AP (Vth_low) switches from the decrease to the increase. As a result, the period SW_ON (P) in BL@P (Vth_high) is longer than the period SW_ON (AP) in BL@AP (Vth_low).

As described above, with the sense circuit 400 according to the present embodiment, when the electric resistance of the memory cell MC is relatively large, the period SW_ON (AP) in which the switching element SW1 is in the on state is relatively short. On the other hand, when the electric resistance of the memory cell MC is relatively small, the period SW_ON (P) in which the switching element SW1 is in an on state is relatively long. In other words, the sense circuit 400 determines a period in which the switching element SW1 is in an on state according to the electric resistance of the memory cell MC.

As shown in FIG. 11, the voltage VDL of BL@AP (Vth_low) rises from the time TO, and the voltage VDL of BL@P (Vth_high) rises from the time T1. There is no significant difference between the voltages VDL of both BL@AP (Vth_low) and BL@P (Vth_high) at the time TAP. Meanwhile, the period SW_ON (P) in BL@P (Vth_high) is longer than the period SW_ON (AP) in BL@AP (Vth_low), and thus, the voltage VDL of the BL@P (Vth_high) continues to rise until the time TP. As a result, when the switching element SW1 is switched to the off state, the voltage VDL (P) of the BL@P (Vth_high) is larger than the voltage VDL (AP) of the BL@AP (Vth_low).

Even when the state of the memory cell MC cannot be determined in the sense circuit of the related art shown in the comparative examples, as described above, with the sense circuit 400 according to the present embodiment, the period in which the switching element SW1 is in the on state can be determined according to the electric resistance of the memory cell MC, so that the state of the memory cell MC can be determined.

1-10. Modification Example 1

Modification Example 1 of the sense circuit 400 according to the first embodiment will be described with reference to FIG. 12. FIG. 12 is a circuit diagram for executing the sense operation of the memory device according to Modification Example 1 of the first embodiment. A sense circuit 400A shown in FIG. 12 is similar to the sense circuit 400 shown in FIG. 7, but is different in that a transistor TR2 is provided instead of the resistance element R1. Since the rest of the configuration of the sense circuit 400A is the same as the configuration of the sense circuit 400 in FIG. 7, the description thereof will be omitted.

As shown in FIG. 12, the transistor TR2 is provided between the second power line VH2 and the first node A. The transistor TR2 is used as a first element having a resistance component. The transistor TR2 includes a first terminal TS3, a second terminal TD3, and a gate terminal TG3. The first terminal TS3 is connected to the second power line VH2. The second terminal TD3 and the gate terminal TG3 are connected to the first node A. That is, the transistor TR2 functions as a diode. In the present embodiment, the transistor TR2 is PMOS similarly to the switching element SW1 and the transistor TR1. In the case of the present embodiment, for example, the high voltage VHH is supplied to the first power line VH1 and the second power line VH2.

In the sense circuit 400A, before the sense operation is started, the voltage lower than the voltage (VHH-Vth) obtained by subtracting the threshold voltage Vth of the transistor TR2 from the high voltage VHH supplied to the second power line VH2 is supplied to the first node A. Since the potential difference between the first terminal TS3 and the gate terminal TG3 is smaller than the threshold voltage Vth, the transistor TR2 is controlled to be in an on state. As a result, the voltage of the first node A is lowered. When the voltage of the first node A (gate terminal TG3) reaches the voltage (VHH-Vth) which is lower than the voltage of the first terminal TS3 by the above-described threshold voltage Vth, the transistor TR2 is controlled to be in an off state, and the first node A is held at (VHH-Vth). In this way, since (VHH-Vth) is supplied to the first node A, the switching element SW1 is also controlled to be in an off state.

When the sense operation is started, the voltage VBL of the bit line BL decreases, and the voltage VA of the first node A also decreases. As a result, since the potential difference between the first terminal TS3 and the gate terminal TG3 is larger than the above-described threshold voltage Vth, the transistor TR2 is switched to an on state. As a result, since the charge is supplied from the second power line VH2 to the first node A, the voltage VA of the first node A rises, and the transistor TR2 is switched to the off state when the voltage VA reaches (VHH-Vth). Therefore, in the sense circuit 400A, the same operation as that in FIG. 8 is performed.

As described above, even in the sense circuit 400A according to Modification Example 1, the state of the memory cell MC can be determined in the same manner as in the sense circuit 400.

1-11. Modification Example 2

Figure 13:
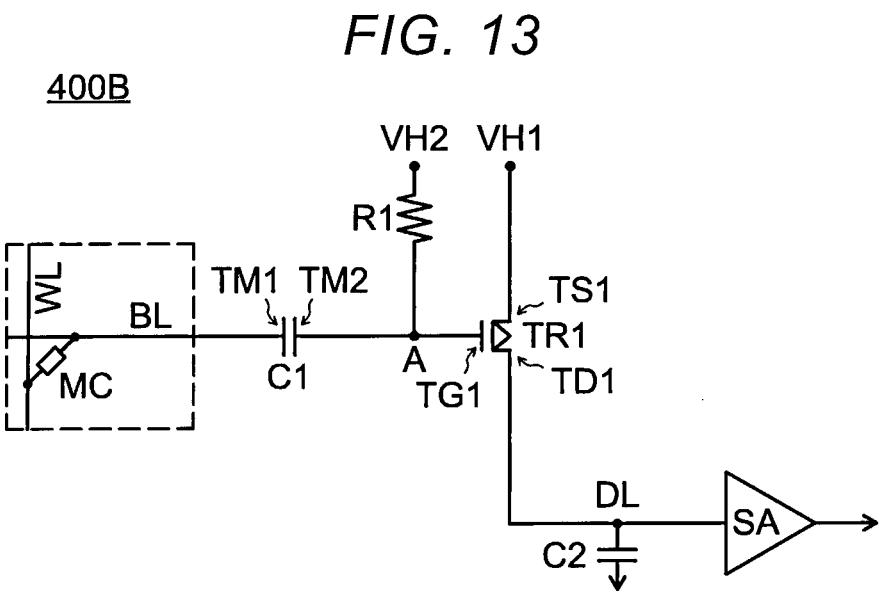
FIG. 13 is a circuit diagram for executing the sense operation of the memory device according to a second modification example of the first embodiment.

Modification Example 2 of the sense circuit 400 according to the first embodiment will be described with reference to FIG. 13. FIG. 13 is a circuit diagram for executing the sense operation of the memory device according to Modification Example 2 of the first embodiment. A sense circuit 400B shown in FIG. 13 is similar to the sense circuit 400 shown in FIG. 7, but is different in that the first node A is connected to the gate terminal TG1 of the transistor TR1, and the switching element SW1 is omitted. Since the rest of the configuration of the sense circuit 400B is the same as the configuration of the sense circuit 400 in FIG. 7, the description thereof will be omitted.

As shown in FIG. 13, the first node A is connected to the gate terminal TG1 of the transistor TR1 such that the current can be supplied, but the bit line BL is not connected to the gate terminal TG1 such that the current can be supplied. In other words, the gate terminal TG1 is connected to the bit line BL via the capacitance element C1. That is, the voltage fluctuation of the bit line BL is transmitted to the first node A via the capacitance element C1. A voltage for controlling the transistor TR1 to be in an off state is supplied to the first power line VH1 and the second power line VH2. In the case of the present embodiment, for example, a high voltage VHH is supplied to the first power line VH1, and a voltage (VHH-Vth) smaller than the high voltage VHH by the threshold voltage Vth of the switching element SW1 is supplied to the second power line VH2.

In the sense circuit 400B, the voltage VBL of the bit line BL, the voltage VA of the first node A, and the voltage VDL of the data wiring DL exhibit the same behavior as in FIG. 8. Before the sense operation is started, a voltage is supplied to the voltage VA of the first node A from the second power line VH2, so that the transistor TR1 is in an off state. When the sense operation is started at the time T0, the voltage VA of the first node A also decreases with the decrease in the voltage VBL due to the capacitive coupling via the capacitance element C1. When the voltage VA is lowered and the potential difference between the first terminal TS1 and the gate terminal TG1 exceeds the threshold voltage Vth of the transistor TR1, the transistor TR1 (PMOS) is switched from the off state to the on state.

The decrease amount of the voltage VA of the first node A reflects the fluctuation amount of the voltage VBL of the bit line BL. As described above, the fluctuation amount of the voltage VBL reflects the electric resistance of the memory cell MC. Therefore, when the electric resistance of the memory cell MC is small, the decrease amount of the voltage VA (A@P) is large, and the period in which the transistor TR1 is controlled to be in an off state is long. On the other hand, when the electric resistance of the memory cell MC is large, the decrease amount of the voltage VA (A@AP) is small, and the period in which the transistor TR1 is controlled to be in an off state is short. As a result, when the electric resistance of the memory cell MC is small, the voltage VDL (DL@P) of the data wiring DL is relatively high voltage, and when the electric resistance of the memory cell MC is large, the voltage VDL (DL@AP) of the data wiring DL is relatively low voltage.

As described above, even in the sense circuit 400B according to Modification Example 2, the state of the memory cell MC can be determined in the same manner as in the sense circuit 400.

2. Second Embodiment

A sense circuit 400C according to a second embodiment will be described with reference to FIGS. 14 and 15. The sense circuit 400C according to the second embodiment is similar to the sense circuit 400 according to the first embodiment. In the following description, the description of the configuration similar to the sense circuit 400 according to the first embodiment will be omitted, and the description will be made mainly of the difference from the sense circuit 400. Since the configuration other than the sense circuit 400C used in the second embodiment is the same as that of the first embodiment, the description thereof will be omitted.

2-1. Sense Circuit

Figure 14:
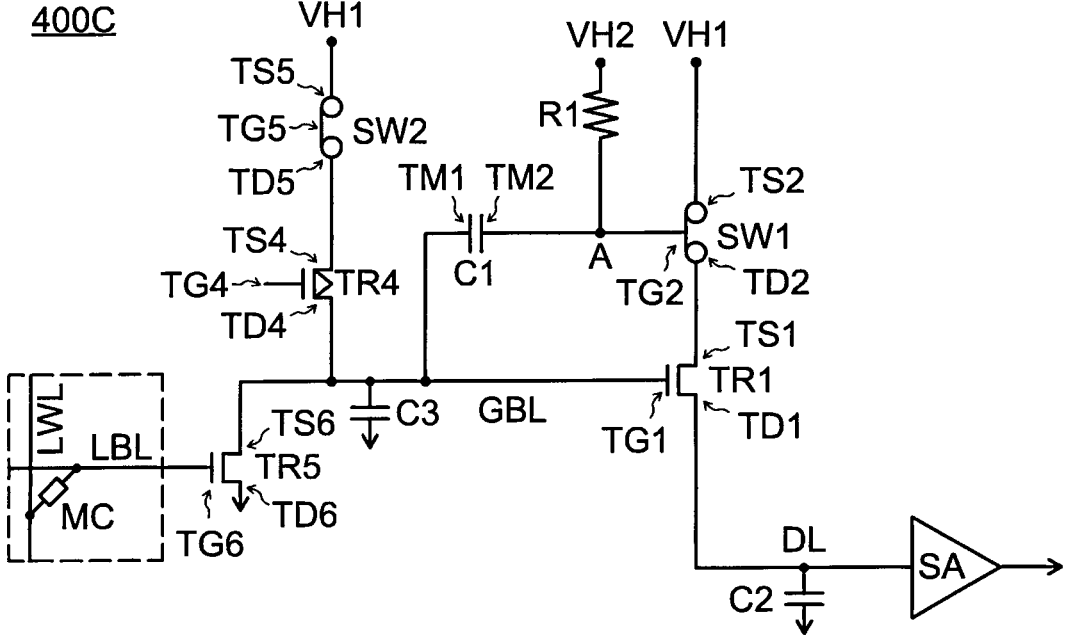
FIG. 14 is a circuit diagram for executing the sense operation of the memory device according to a second embodiment.

FIG. 14 is a circuit diagram for executing the sense operation of the memory device according to the embodiment. The sense circuit 400C includes a switching element SW2, a transistor TR4, a transistor TR5, and the capacitance element C3 in addition to the sense circuit 400 shown in FIG. 7. The capacitance element C3 is connected to the global bit line GBL. In the present embodiment, the switching element SW2 and the transistor TR4 are PMOS transistors, and the switching element SW1, the transistor TR1, and the transistor TR5 are NMOS. In FIG. 14, the global bit line GBL and the local bit line LBL are shown in a distinguishable manner. The memory cell MC is provided between the local word line LWL and the local bit line LBL. The transistor TR1 and the capacitance element C1 are connected to the global bit line GBL.

The switching element SW2 and the transistor TR4 are connected in series between the global bit line GBL and the first power line VH1. The transistor TR4 is a three-terminal type element including a first terminal TS4, a second terminal TD4, and a gate terminal TG4. The switching element SW2 is a three-terminal type element including a first terminal TS5, a second terminal TD5, and a gate terminal TG5. The first terminal TS5 is connected to the first power line VH1. The second terminal TD5 is connected to the first terminal TS4. The second terminal TD4 is connected to the global bit line GBL.

The transistor TR4 is used as an element that controls the current amount between the first terminal TS4 and the second terminal TD4 according to the voltage supplied to the gate terminal TG4. The switching element SW2 is used as an element that switches between an on state and an off state. The switching element SW2 and the transistor TR4 may be collectively referred to as a precharge circuit.

The transistor TR5 is a three-terminal type element including a first terminal TS6, a second terminal TD6, and a gate terminal TG6. The first terminal TS6 is connected to the global bit line GBL. The second terminal TD6 is grounded. The gate terminal TG6 is connected to the local bit line LBL. The transistor TR5 is used as an element that controls the current amount between the first terminal TS6 and the second terminal TD6 according to the voltage supplied to the gate terminal TG6. That is, the amount of current flowing through the transistor TR5 is determined according to the electric resistance of the memory cell MC.

2-2. Operation of Sense Circuit

The operation of the sense circuit 400C will be described with reference to FIGS. 14 and 15. FIG. 15 is a view showing the sense operation of the memory device according to the embodiment. In FIG. 15, a voltage VLBL of the local bit line LBL, a voltage VGBL of the global bit line GBL, the voltage VA of the first node A, and the voltage VDL of the data wiring DL are shown to be aligned vertically. In each graph showing the voltage, the voltage (@P) when the electric resistance of the memory cell MC is small and the voltage (@AP) when the electric resistance of the memory cell MC is large are shown. In these graphs, the time T0 is a start time of the sense operation.

Figure 15:
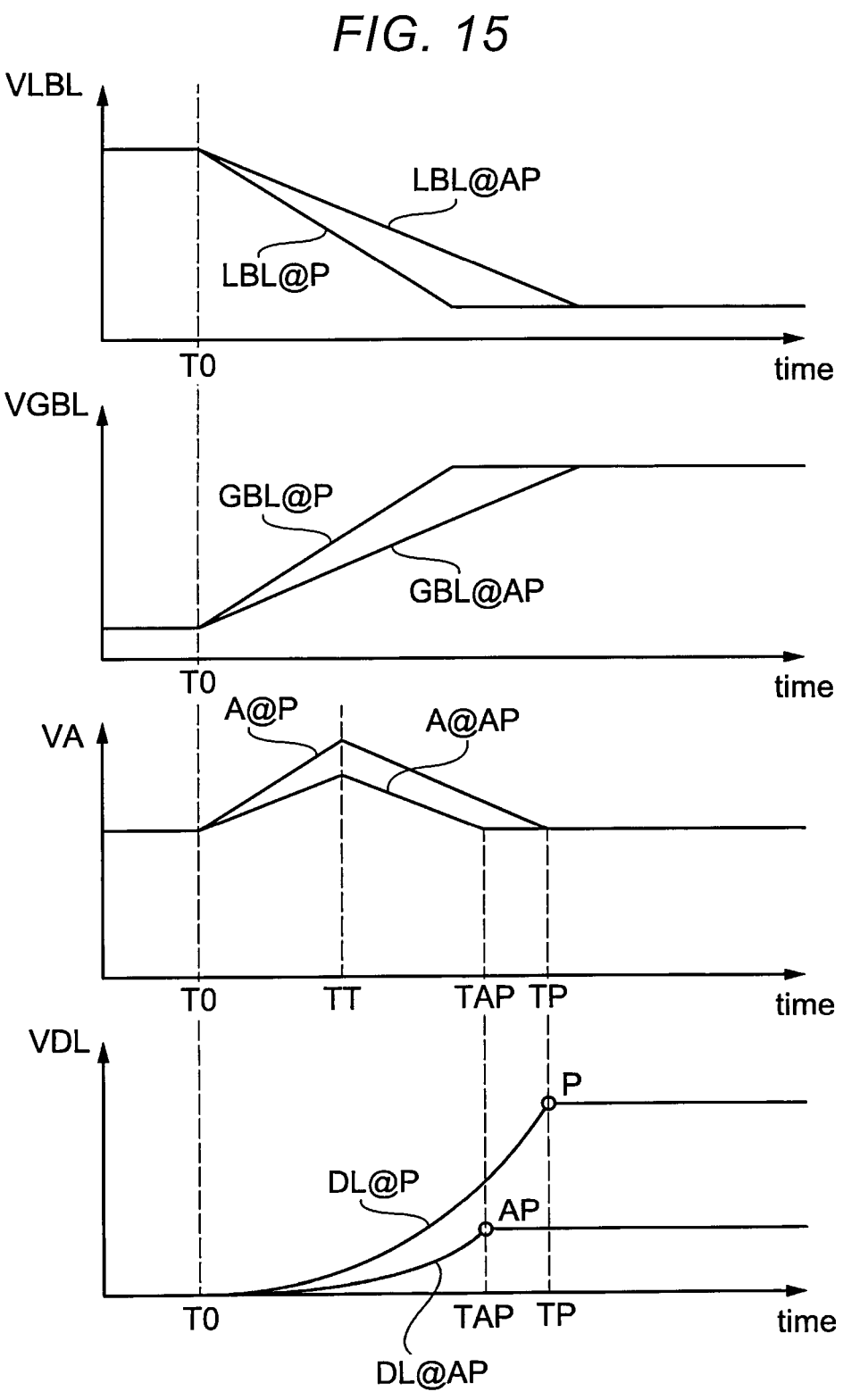
FIG. 15 is a view showing the sense operation of the memory device according to the second embodiment.

In FIG. 15, the voltage VLBL corresponding to @P is indicated by LBL@P, and the voltage VLBL corresponding to @AP is indicated by LBL@AP. Similarly, the voltage VGBL corresponding to @P is indicated by GBL@P, and the voltage VGBL corresponding to @AP is indicated by GBL@AP. Similarly, the voltage VA corresponding to @P is indicated by A@P, and the voltage VA corresponding to @AP is indicated by A@AP. Similarly, a voltage VDL corresponding to @P is indicated by DL@P, and a voltage VDL corresponding to @AP is indicated by DL@AP.

As shown in the graph of the voltage VLBL of FIG. 15, when the sense operation is started at the time T0, the voltage VLBL of the local bit line LBL decreases. The decrease in the voltage VLBL of the LBL@P due to the electric resistance of the memory cell MC is faster than the decrease in the voltage VLBL of the LBL@AP. At the same timing as the start of the sense operation or at a timing synchronized with the start of the sense operation, the switching element SW2 is switched from the off state to the on state, and the voltage from the first power line VH1 is supplied to the global bit line GBL via the precharge circuit.

At the time T0, since the second terminal TD6 is grounded and the gate terminal TG6 is supplied with the H level voltage, the transistor TR5 is in an on state. As the time elapses from the time T0, the voltage VLBL gradually decreases, so that the amount of current flowing through the transistor TR5 is reduced. Immediately after the sense operation is started (at the time TO), the voltage VGBL is low because the amount of current flowing through the transistor TR5 is larger than the amount of current flowing through the transistor TR4. However, after a certain time elapses from the time T0, the amount of current flowing through the transistor TR4 is larger than the amount of current flowing through the transistor TR5. As a result, the voltage VGBL is increased because the amount of the charges supplied from the first power line VH1 to the global bit line GBL via the transistor TR4 is dominant.

As shown in the graph of the voltage VGBL in FIG. 15, the voltage VGBL gradually increases from the time T0. The increase in the voltage VGBL of the GBL@P is faster than the increase in the voltage VGBL of the GBL@AP, reflecting the behavior of the voltage VLBL.

A voltage for controlling the switching element SW1 to off state is supplied to the first power line VH1 and the second power line VH2, and both the voltage VBL and the voltage VA are at the L level, so that the switching element SW1 is in an off state before the sense operation is started. For example, the high voltage VHH is supplied to the first power line VH1, and a voltage (VHH-Vth) smaller than the high voltage VHH by the threshold voltage Vth of the switching element SW1 is supplied to the second power line VH2. Meanwhile, the L level of the voltage VA corresponds to the voltage supplied from the second power line VH2. A low voltage VSS is supplied to the data wiring DL before the switching element SW1 is switched from the on state to the off state as follows.

Since the global bit line GBL and the first node A are capacitively coupled by the capacitance element C1, when the sense operation is started at the time T0, the voltage VGBL of the global bit line GBL increases, and the voltage VA of the first node A also increases. When the voltage VA is increased and the potential difference between the first terminal TS2 and the gate terminal TG2 exceeds the threshold voltage Vth of the switching element SW1, the switching element SW1 (NMOS) is switched from the off state to the on state.

Although the first node A is connected to the second power line VH2, the resistance element R1 is provided between the first node A and the second power line VH2, so that a delay occurs when the voltage VA of the first node A is returned to the same potential as the second power line VH2. As a result, the voltage VA of the first node A increases from the time T0, but then decreases with the transfer of the charge to the second power line VH2. In FIG. 15, a point in time at which the voltage VA is switched from the increase to the decrease is referred to as a time TT. The voltage VA decreases from the time TT, and the potential difference between the first terminal TS2 and the gate terminal TG2 is equal to or lower than the threshold voltage Vth of the switching element SW1, so that the switching element SW1 is switched to the off state.

As described above, since the increase in the voltage VGBL of the GBL@P is faster than the increase in the voltage VGBL of the GBL@AP, the voltage VA of the A@P at the time TT is higher than the voltage VA of the A@AP. As a result, the time TP at which the voltage VA of the A@P returns to the L level is later than the time TAP at which the voltage VA of the A@AP returns to the L level.

The voltage VGBL is a voltage supplied to the gate terminal TG1 of the transistor TR1. The voltage VA is a voltage supplied to the gate terminal TG2 of the switching element SW1. In the present embodiment, since both the transistor TR1 and the switching element SW1 are NMOS and the low voltage VSS is supplied to the data wiring DL, the voltage VGBL and the voltage VA rise, and the potential difference between the second terminal TD1 and the gate terminal TG1 is larger than the threshold voltage Vth of the transistor TR1. When the potential difference between the second terminal TD2 and the gate terminal TG2 is larger than the threshold voltage Vth of the switching element SW1, the transistor TR1 and the switching element SW1 are switched to the on state. As a result, the voltage VDL of the data wiring DL gradually increases due to the charge supplied from the first power line VH1. As shown in the graph of the voltage VDL in FIG. 15, the voltage VDL starts to rise from the time T0. When the voltage VDL reaches the time TP or the time TAP at which the switching element SW1 is switched to the off state, the rise of the voltage VDL ends. As a result, the voltage VDL (P) of the DL@P is higher than the voltage VDL (AP) of the DL@AP. The sense circuit 400 can determine the state of the memory cell MC by using the above-described potential difference.

As described above, with the sense circuit 400C according to the present embodiment, the same effects as those of the sense circuit 400 according to the first embodiment can be obtained. Further, with the sense circuit 400C, the local bit line LBL and the global bit line GBL can be separated by the transistor TR5, so that it is possible to prevent the application of an unnecessary voltage to the memory cell MC.

2-3. Modification Example 1

Figures 16, 17:
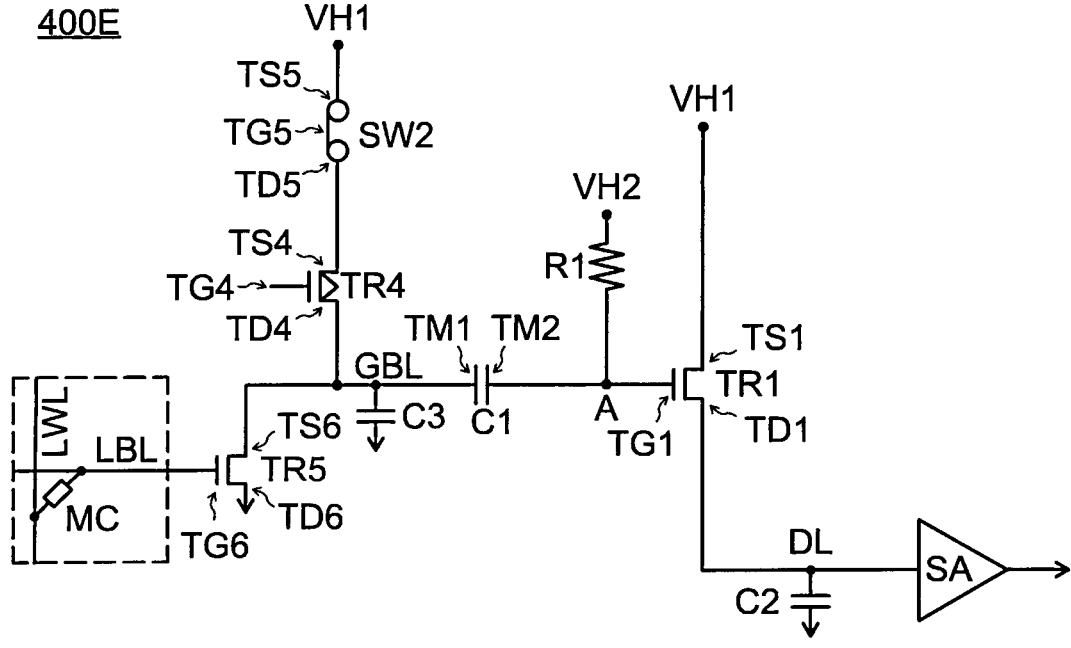
FIG. 16 is a circuit diagram for executing the sense operation of the memory device according to a first modification example of the second embodiment.
FIG. 17 is a circuit diagram for executing the sense operation of the memory device according to a second modification example of the second embodiment.

Modification Example 1 of the sense circuit 400C according to the second embodiment will be described with reference to FIG. 16. FIG. 16 is a circuit diagram for executing the sense operation of the memory device according to Modification Example 1 of the second embodiment. A sense circuit 400D shown in FIG. 16 is similar to the sense circuit 400C shown in FIG. 14, but is different in that the transistor TR2 is provided instead of the resistance element R1. Since the rest of the configuration of the sense circuit 400D is the same as the configuration of the sense circuit 400C in FIG. 14, the description thereof will be omitted.

As shown in FIG. 16, the transistor TR2 is provided between the second power line VH2 and the first node A. The transistor TR2 is used as a first element having a resistance component. The transistor TR2 includes a first terminal TS3, a second terminal TD3, and a gate terminal TG3. The first terminal TS3 is connected to the second power line VH2. The second terminal TD3 and the gate terminal TG3 are connected to the first node A. That is, the transistor TR2 functions as a diode. In the present embodiment, the transistor TR2 is NMOS similarly to the switching element SW1 and the transistor TR1. In the case of the present embodiment, for example, the low voltage VSS is supplied to the first power line VH1 and the second power line VH2.

In the sense circuit 400D, before the sense operation is started, the voltage higher than the voltage (VSS+Vth) obtained by adding the threshold voltage Vth of the transistor TR2 to the low voltage VSS supplied to the second power line VH2 is supplied to the first node A. Since the potential difference between the first terminal TS3 and the gate terminal TG3 is larger than the threshold voltage Vth, the transistor TR2 is controlled to be in an on state. As a result, the voltage of the first node A is increased. When the voltage of the first node A (gate terminal TG3) reaches the voltage (VSS+Vth) which is larger than the voltage of the first terminal TS3 by the above-described threshold voltage Vth, the transistor TR2 is controlled to be in an off state, and the first node A is held at (VSS+Vth). In this way, since (VSS+Vth) is supplied to the first node A, the switching element SW1 is also controlled to be in an off state.

When the sense operation is started, the voltage VGBL of the global bit line GBL increases, and the voltage VA of the first node A also increases. As a result, since the potential difference between the first terminal TS3 and the gate terminal TG3 is larger than the above-described threshold voltage Vth, the transistor TR2 is switched to an on state. As a result, since the charge is transferred from the first node A to the second power line VH2, the voltage VA of the first node A decreases, and the transistor TR2 is switched to the off state when the voltage VA reaches (VSS+Vth). Therefore, in the sense circuit 400D, the same operation as that in FIG. 15 is performed.

As described above, even in the sense circuit 400D according to Modification Example 1, the state of the memory cell MC can be determined in the same manner as in the sense circuit 400C.

2-4. Modification Example 2

Modification Example 2 of the sense circuit 400C according to the second embodiment will be described with reference to FIG. 17. FIG. 17 is a circuit diagram for executing the sense operation of the memory device according to Modification Example 2 of the second embodiment. A sense circuit 400E shown in FIG. 17 is similar to the sense circuit 400C shown in FIG. 14, but is different in that the first node A is connected to the gate terminal TG1 of the transistor TR1, and the switching element SW1 is omitted. Since the rest of the configuration of the sense circuit 400E is the same as the configuration of the sense circuit 400C in FIG. 14, the description thereof will be omitted.

As shown in FIG. 17, the first node A is connected to the gate terminal TG1 of the transistor TR1 such that the current can be supplied, but the global bit line GBL is not connected to the gate terminal TG1 such that the current can be supplied. In other words, the gate terminal TG1 is connected to the global bit line GBL via the capacitance element C1. That is, the voltage fluctuation of the global bit line GBL is transmitted to the first node A via the capacitance element C1. A voltage for controlling the transistor TR1 to be in an off state is supplied to the first power line VH1 and the second power line VH2. In the case of the present embodiment, for example, the high voltage VHH is supplied to the first power line VH1, and a voltage (VHH-Vth) smaller than the high voltage VHH by the threshold voltage Vth of the switching element SW1 is supplied to the second power line VH2.

In the sense circuit 400E, the voltage VGBL of the global bit line GBL, the voltage VA of the first node A, and the voltage VDL of the data wiring DL exhibit the same behavior as in FIG. 15. Before the sense operation is started, a voltage is supplied to the voltage VA of the first node A from the second power line VH2, so that the transistor TR1 is in an off state. When the sense operation is started at the time T0, the voltage VA of the first node A also increases with the increase in the voltage VGBL due to the capacitive coupling via the capacitance element C1. When the voltage VA is increased and the potential difference between the first terminal TS1 and the gate terminal TG1 exceeds the threshold voltage Vth of the transistor TR1, the transistor TR1 (NMOS) is switched from the off state to the on state.

The increase amount of the voltage VA of the first node A reflects the fluctuation amount of the voltage VGBL of the global bit line GBL. As described above, the fluctuation amount of the voltage VGBL reflects the electric resistance of the memory cell MC. Therefore, when the electric resistance of the memory cell MC is small, the increase amount of the voltage VA (A@P) is large, and the period in which the transistor TR1 is controlled to be in an off state is long. On the other hand, when the electric resistance of the memory cell MC is large, the increase amount of the voltage VA (A@AP) is small, and the period in which the transistor TR1 is controlled to be in an off state is short. As a result, when the electric resistance of the memory cell MC is small, the voltage VDL (DL@P) of the data wiring DL is relatively high voltage, and when the electric resistance of the memory cell MC is large, the voltage VDL (DL@AP) of the data wiring DL is relatively low voltage.

As described above, even in the sense circuit 400E according to Modification Example 2, the state of the memory cell MC can be determined in the same manner as in the sense circuit 400C.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory device comprising:
first wiring;
second wiring;
a memory cell connected between the first wiring and the second wiring;
a first power line;
a sense amplifier;
a current control circuit provided between the first power line and the sense amplifier and including a control terminal connected to a first node;
a capacitance element provided between the first node and the second wiring and including a first terminal electrically connected to the second wiring and a second terminal connected to the first node;
a second power line; and
a first element having an electrical resistance provided between the first node and the second power line.

2. The memory device according to claim 1,
wherein the first wiring extends in a first direction, and the second wiring extends in a second direction intersecting the first direction.

3. The memory device according to claim 1,
wherein the electrical resistance of the first element is larger than an electrical resistance between the second terminal and the control terminal.

4. The memory device according to claim 1,
wherein a voltage of the first node is changed based on a change in a voltage of the second wiring, and the current control circuit is switched between an off state and an on state according to the voltage of the first node.

5. The memory device according to claim 1,
wherein the current control circuit includes a first transistor provided between the first power line and the sense amplifier, and
a first gate terminal of the first transistor is the control terminal.

6. The memory device according to claim 5,
wherein the first element having the electrical resistance is a second transistor, a conductive type of which is the same as a conductive type of the first transistor.

7. The memory device according to claim 1,
wherein the current control circuit includes a first transistor and a second transistor that are connected in series between the first power line and the sense amplifier,
a first gate terminal of the first transistor is electrically connected to the second wiring, and
a second gate terminal of the second transistor is the control terminal.

8. The memory device according to claim 7,
wherein the first element having the electrical resistance is a third transistor, a conductive type of which is the same as a conductive type of the first transistor.

9. The memory device according to claim 1, further comprising:
a third transistor having a third gate terminal; and
a third wiring provided between the third transistor and the capacitance element,
wherein the third gate terminal is connected to the second wiring.

10. The memory device according to claim 1,
wherein the first element is a resistance element formed in a semiconductor layer into which an impurity is introduced.

11. The memory device according to claim 1,
wherein the capacitance element is formed of a semiconductor layer, a gate insulating layer, and a gate electrode of a transistor.

12. The memory device according to claim 1,
wherein the memory cell includes a variable resistance element and a switching element,
the variable resistance element is an element that is switched to a low resistance state or a high resistance state, and
the switching element is a two-terminal element that is switched to a low resistance state or to a high resistance state according to a voltage applied across the two terminals of the switching element, wherein a resistance of the switching element in the low resistance state is lower than a resistance of the variable resistance element in the low resistance state and a resistance of the switching element in the high resistance state is higher than a resistance of the variable resistance element in the high resistance state.

13. The memory device according to claim 12,
wherein the first wiring extends in a first direction, and the second wiring extends in a second direction intersecting the first direction, and the variable resistance element and the switching element are provided at a position where the first wiring and the second wiring intersect when viewed in a third direction intersecting the first and second directions.

14. The memory device according to claim 12,
wherein the variable resistance element is a magnetoresistive effect element.

15. A memory device comprising:

first wiring extending in a first direction;

second wiring extending in a second direction intersecting the first direction;

a memory cell connected between the first wiring and the second wiring at a location where the first wiring and the second wiring intersect when viewed in a third direction intersecting the first and second directions;

a first power line;

a sense amplifier;

a current control circuit having a first transistor provided between the first power line and the sense amplifier, the first transistor having a gate connected to a first node;

a capacitance element provided between the first node and the second wiring and including a first terminal and a second terminal connected to the first node;

a second power line;

a first element having an electrical resistance provided between the first node and the second power line; and a second transistor having a gate connected to the second wiring, a first terminal connected to the first terminal of the capacitance element, and a second terminal connected to ground.

16. The memory device according to claim 15, wherein the current control circuit further includes a third transistor provided between the first transistor and the sense amplifier, the third transistor having a gate connected to the first terminal of the capacitance element and the first terminal of the second transistor.

17. The memory device according to claim 16, wherein the second and third transistors are NMOS transistors.

18. A memory device comprising:

first wiring;

second wiring;

a memory cell connected between the first wiring and the second wiring;

a first power line;

a sense amplifier;

a current control circuit provided between the first power line and the sense amplifier, the current control circuit including a first transistor that is turned on or off to control current flowing between the first power line and the sense amplifier;

a second power line;

a first element having an electrical resistance electrically connected between the second power line and a gate of the first transistor; and a capacitance element electrically connected between the second wiring and the first element and between the second wiring and the gate of the first transistor.

19. The memory device according to claim 18, wherein the current control circuit further includes a second transistor provided between the first transistor and the sense amplifier, the second transistor having a gate connected to the second wiring.

20. The memory device according to claim 19, wherein the first element having the electrical resistance is a third transistor, a conductive type of which is the same as a conductive type of the first and second transistors.

\*　　\*　　\*　　\*　　\*